(12) United States Patent
Yu et al.

(10) Patent No.: US 12,519,209 B2
(45) Date of Patent: Jan. 6, 2026

(54) ANTENNA STRUCTURE ON PACKAGE

(71) Applicant: Advanced Semiconductor Engineering, Inc., Kaohsiung (TW)

(72) Inventors: Yuanhao Yu, Kaohsiung (TW); Weifan Wu, Kaohsiung (TW); Yong-Chang Syu, Kaohsiung (TW); Chung Ju Yu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 202 days.

(21) Appl. No.: 18/137,391

(22) Filed: Apr. 20, 2023

(65) Prior Publication Data

US 2024/0356197 A1    Oct. 24, 2024

(51) Int. Cl.
*H01Q 1/22* (2006.01)
*H01L 23/00* (2006.01)
*H01L 23/498* (2006.01)
*H01Q 9/04* (2006.01)
*H01Q 21/00* (2006.01)
*H01L 25/065* (2023.01)

(52) U.S. Cl.
CPC ..... *H01Q 1/2283* (2013.01); *H01L 23/49811* (2013.01); *H01Q 9/0407* (2013.01); *H01Q 21/00* (2013.01); *H01L 24/13* (2013.01); *H01L 24/16* (2013.01); *H01L 25/0655* (2013.01); *H01L 2224/13124* (2013.01); *H01L 2224/13144* (2013.01); *H01L 2224/13147* (2013.01); *H01L 2224/16225* (2013.01); *H01Q 9/0421* (2013.01)

(58) Field of Classification Search
CPC .... H01Q 1/2283; H01Q 9/0407; H01Q 21/00; H01Q 9/0421; H01L 23/49811; H01L 24/13; H01L 24/16; H01L 25/0655; H01L 2224/13124; H01L 2224/13144; H01L 2224/13147; H01L 2224/16225; H01L 23/66; H01L 2223/6677
See application file for complete search history.

(56) References Cited

U.S. PATENT DOCUMENTS

| | | | |
|---|---|---|---|
| 2005/0285794 A1* | 12/2005 | Tang | H01L 23/04 257/E23.181 |
| 2007/0200768 A1* | 8/2007 | Goldberger | H01L 25/165 343/700 MS |
| 2018/0190600 A1 | 7/2018 | Kook et al. | |
| 2024/0258683 A1* | 8/2024 | Herbsommer | H01Q 21/0087 |

FOREIGN PATENT DOCUMENTS

CN          108269790 A        7/2018

* cited by examiner

*Primary Examiner* — Dimary S Lopez Cruz
*Assistant Examiner* — Anna N Hamadyk
(74) *Attorney, Agent, or Firm* — FOLEY & LARDNER LLP

(57) ABSTRACT

The present disclosure provides an electronic device, which includes an encapsulant, an electronic component, an antenna structure, and a first conductive element. The electronic component is disposed in the encapsulant. The antenna structure has an antenna pattern exposed to air and facing the encapsulant, and a first supporting element separating the antenna pattern from the encapsulant. At least a portion of the first conductive element is within the encapsulant, and electrically connects the antenna pattern to the electronic component by the first supporting element.

14 Claims, 40 Drawing Sheets

ANTENNA STRUCTURE ON PACKAGE

BACKGROUND

1. Technical Field

The present disclosure relates to antennae, and, in particular, to an antenna structure disposed on a semiconductor package.

2. Description of the Related Art

With advents in technology, wireless communication devices such as portable devices, wearable devices, and others, are continually reduced in size. Antennae, however, cannot be directly attached to printed circuit board (PCB) modules of conventional wireless communication devices, and thus U.FL connectors (e.g., coaxial connectors) are often disposed on the PCB module to connect to external antennae. In addition, such attachment requires the PCB module to be larger, compromising efforts at miniaturization. Moreover, when feed points of the antennae or the direction of signal output are located on the same side of the PCB module, positioning of the antennae will be limited by the pin out, further impeding miniaturization of the wireless communication products.

SUMMARY

One aspect of the present disclosure provides an electronic device, which includes an encapsulant, an electronic component, an antenna structure, and a first conductive element. The electronic component is disposed in the encapsulant. The antenna structure has an antenna pattern exposed to air and facing the encapsulant, and a first supporting element separating the antenna pattern from the encapsulant. At least a portion of the first conductive element is within the encapsulant, and electrically connects the antenna pattern with the electronic component by the first supporting element.

Another aspect of the present disclosure provides an electronic device, which includes: an encapsulant, a first antenna pattern, and a second antenna pattern. The first antenna structure has a first antenna pattern and a first supporting element separating the first antenna pattern from the encapsulant. The second antenna structure has a second antenna pattern and a second supporting element separating the second antenna pattern from the encapsulant. The first antenna pattern is operating in a first frequency, and the second antenna pattern is operating in a second frequency different from the first frequency.

Yet another aspect of the present disclosure provides an electronic device, which includes an encapsulant and an antenna structure. The antenna structure is disposed over and spaced apart from the encapsulant by a conductive connection component, wherein the antenna structure has a first antenna pattern and a second antenna pattern disposed over the first antenna pattern and configured for electrically coupling to the first antenna pattern.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1A:
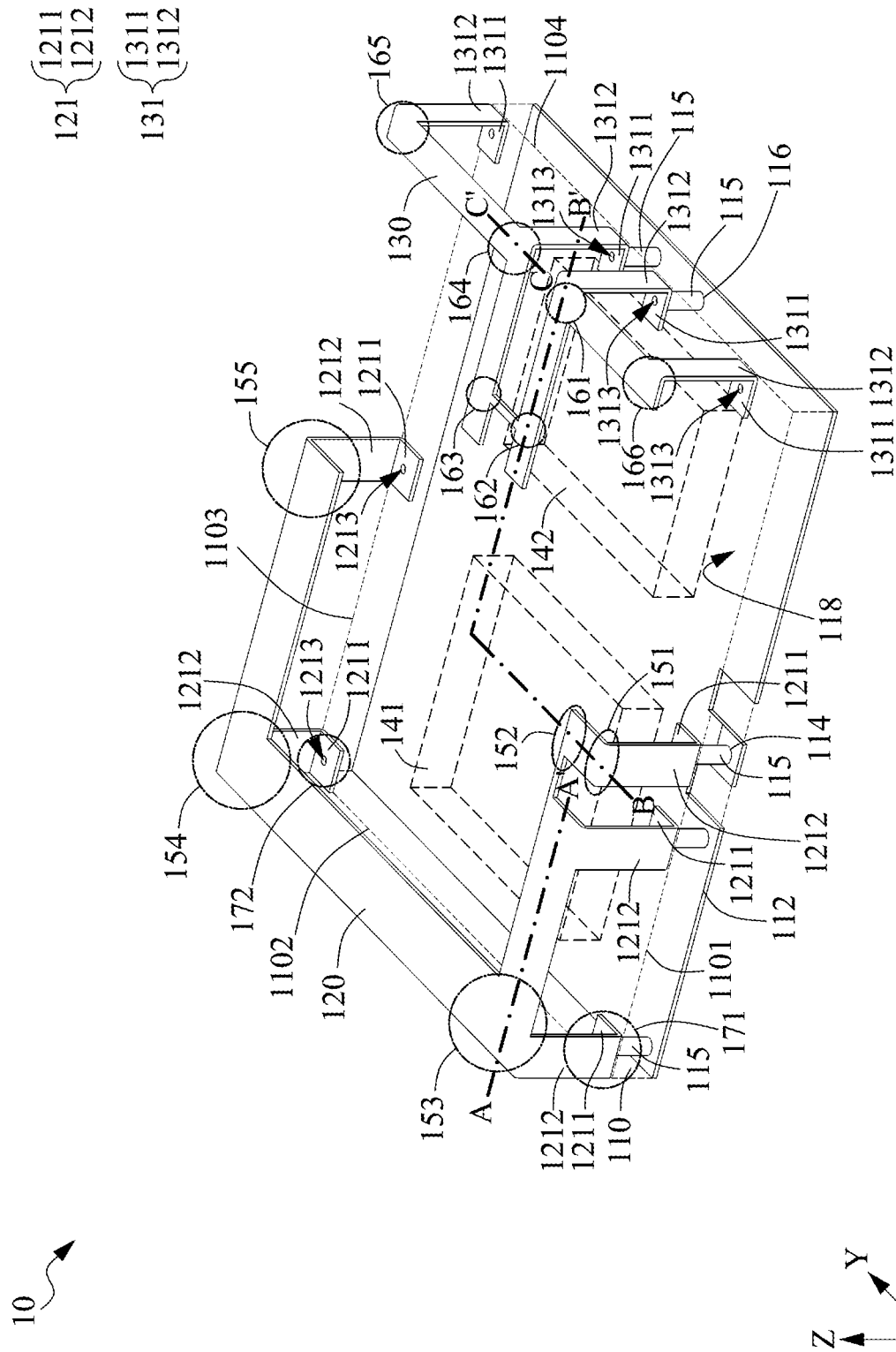
FIG. 1A is a perspective view of an electronic device 10 in accordance with an embodiment of the present disclosure.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

The term "layer" as used herein refers to a portion of material comprising a region having a certain thickness. A layer may extend across the entire underlying or superstructure, or may have an extent that is less than the extent of the underlying or superstructure. In addition, a layer may be a region of a homogeneous or heterogeneous continuous structure, the thickness of which is less than that of the continuous structure. For example, a layer may be located between the top and bottom surfaces of the continuous structure or between any pair of horizontal planes therebetween. Layers may extend horizontally, vertically and/or along the tapered surface. A substrate can be one layer, can include one or more layers therein, and/or can have one or more layers thereon, above, and/or below. A layer can include multiple layers. For example, a semiconductor layer may comprise one or more doped or undoped semiconductor layers, and may be of the same or different materials.

It should be noted that the structures, proportions, sizes, etc. shown in the drawings of the specification are only used to match the content recorded in the specification for the understanding and reading of those skilled in the art, and are not used to limit the implementation of this application, so it has no technical substantive meaning. Any modification of structure, change of proportional relationship or adjustment of size, without affecting the effect and purpose of this application, should still fall within the scope of this application. The disclosed technical content must be within the scope covered. At the same time, terms such as "above", "first", "second" and "one" quoted in this specification are only for the convenience of description and are not used to limit the scope of implementation of this application. The change or adjustment of the relative relationship shall also be regarded as the implementable scope of the present application without substantive change in the technical content.

It should also be noted that the longitudinal section corresponding to the embodiments of the present application can be a section corresponding to the front view direction, the transverse section can be a section corresponding to the right view direction, and the horizontal section can be a section corresponding to the direction of the top view.

Figure 1B:
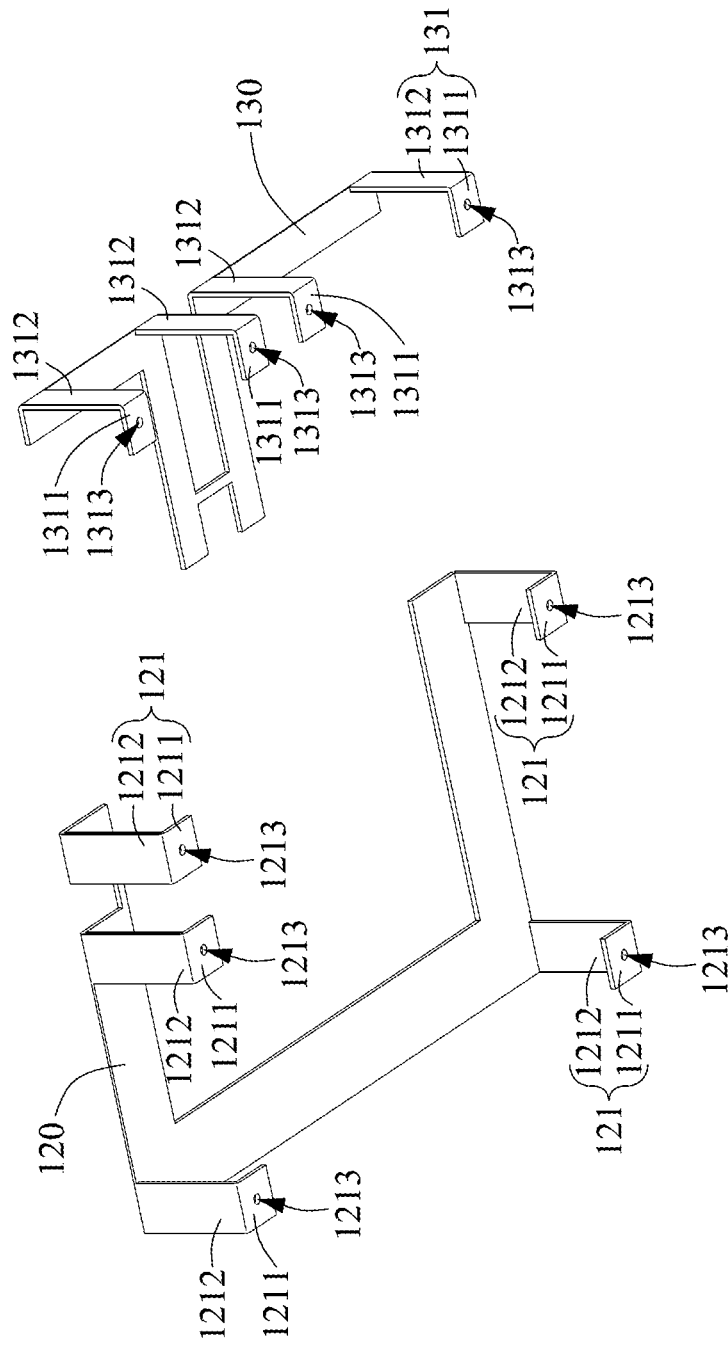
FIG. 1B is a perspective view of antenna structures 120 and 130 of the electronic device 10 in accordance with the embodiment of FIG. 1A.

FIG. 1A is a perspective view of an electronic device 10 in accordance with an embodiment of the present disclosure. FIG. 1B is a perspective view of antenna structures 120 and 130 of the electronic device 10 in accordance with the embodiment of FIG. 1A. Please refer to FIGS. 1A-1B.

In an embodiment, the electronic device 10 may include an encapsulant 110, an antenna structure 120, and an antenna structure 130. The encapsulant 110 may encapsulate a substrate 112 of a printed circuit board on which one or more electronic components 141 and 142 are disposed. For example, the encapsulant 110 may be implemented using epoxy or epoxy blends, silicone, polyimide, or either solvent-based or room temperature vulcanizable agents. Each of the electronic components 141 and 142 may be a chip or a die including a semiconductor substrate, one or more integrated circuit devices, and one or more overlying interconnection structures therein. The integrated circuit devices may include active devices such as transistors and/or passive devices such as resistors, capacitors, inductors, or a combination thereof. In some embodiments, each of the electronic components 141 and 142 may include a transmitter, a receiver, or a transceiver. In some embodiments, each of the electronic component 141 and 142 may include a radio frequency IC (RFIC). In some embodiments, there may be any number of electronic components depending on design requirements.

For purposes of description, the electronic components 141 and 142 encapsulated in the encapsulant 110 may include a Bluetooth™ transceiver and an ultra-wideband (UWB) transceiver, respectively, but the present disclosure is not limited thereto. The electronic components 141 and 142 may be changed to transceivers complying with other wireless communication protocols. The Bluetooth™ transceiver and an ultra-wideband (UWB) transceiver may be implemented by application-specific integrated circuits (ASICs). For example, Bluetooth is a short-range wireless technology standard that is used for exchanging data between fixed and mobile devices over short distances and building personal area networks (PANs). UWB is a radio technology that can use a very low energy level for short-range, high-bandwidth communications over a larger portion of the radio spectrum, and it can transmit information across a wide bandwidth (e.g., >500 MHZ). This allows for the transmission of a large amount of signal energy without interfering with existing narrowband and carrier wave transmission in the same frequency band.

The antenna structures 120 and 130 are positioned above the top surface of the encapsulant 110 by disposing respective supporting elements 121 and 131 on the top surface of the encapsulant 110. For example, the supporting elements 121 and 131 may be substantially perpendicular to the top surface of the encapsulant 110, and the antenna bodies of the antenna structures 120 and 130 substantially parallel to the top surface of the encapsulant 110. The antenna structures 120 and 130 correspond to respective electronic components 141 and 142 (e.g., Bluetooth transceiver and UWB transceiver) in the encapsulant 110. Since the electronic components 141 and 142 are operating on different frequency bands, the design of overall lengths of the antenna structures 120 and 130 may comply with the wireless communication protocols (e.g., Bluetooth and UWB protocols) used by the electronic components 141 and 142. In some embodiments, the antenna structures 120 and 130 and their supporting elements 121 and 131 may be implemented using conductive metals such as copper, silver, gold, aluminum, etc., but the present disclosure is not limited thereto. In addition, the antenna structure 120 is electrically connected to the electronic component 141 through a corresponding conductive element 115, and the antenna structure 130 is electrically connected to the electronic component 142 through another corresponding conductive element 115. In some embodiments, the conductive element 115 may be a pillar, a solder ball, an interposer, or any other type of interconnection component, and it may be implemented using one of the metal materials such as copper, gold, aluminum, etc., but the present disclosure is not limited thereto.

For purposes of description, the electronic components 141 and 142 are respectively disposed on a first region and a second region (e.g., a left region and a right region) of the substrate 112, and the feed point 114 for the electronic component 141 may be located in the middle of a first side of the substrate 112, and the feed point 116 for the electronic component 142 may be located in the middle of a second side of the substrate 112. The second side may be adjacent or opposite to the first side, depending on the layout placement and wire routing on the substrate 112. It should be noted that the locations of the electronic components 141 and 142 and the feed points 114 and 116 disposed on the substrate 112 can be adjusted according to practical routing of metal wires on the substrate 112.

In some embodiments, the conductive element 115 coupled between the antenna structure 120 and the substrate 112 may define the conductive path between the antenna structure 120 and the substrate 112, and it may function as a feed point or a feeding element of the antenna structure 120. In other embodiments, the intersection point between the substrate 112 and the conductive element 115 can be referred to as a feed point 114. In some embodiments, the electronic component 141 may provide a radio-frequency signal to the antenna structure 120 through the feeding element (or the feed point 114).

In some other embodiments, in the underside perspective view of the antenna structure 120 in FIG. 1B, each of the supporting elements 121 may be an angle frame that includes a first portion 1211 and a second portion 1212, wherein the first portion 1211 is substantially perpendicular to the second portion 1212. The first portion 1211 may be regarded as a bottom frame of the supporting element 121, and the second portion 1212 may extend from the first portion 1211 and can be regarded as the a leg frame of the supporting element 121. The first portion 1211 of each supporting element 121 may be substantially parallel to the top surface of the encapsulant 110, and the second portion 1212 of each supporting element 121 substantially perpendicular to the top surface of the encapsulant 110.

Similarly, each of the supporting elements 131 may be an angle frame that includes a first portion 1311 and a second portion 1312, the first portion 1311 being substantially perpendicular to the second portion 1312. The first portion 1311 may be regarded as a bottom frame of the supporting element 131, and the second portion 1312 may extend from the first portion 1311 and can be regarded as the leg frame of the supporting element 131. The first portion 1311 of each supporting element 131 may be substantially parallel to the top surface of the encapsulant 110, and the second portion 1312 of each supporting element 131 substantially perpendicular to the top surface of the encapsulant 110.

The first portion 1211 has a hole 1213 substantially aligned with the top surface of the conductive element 115. The antenna structure 120 can be fixed to the encapsulant 110 using a connection element (e.g., solder ball) which extends from the bottom surface to the top surface of each first portion 1211 so as to improve sturdiness of the electronic device 10, wherein the connection element will not leak to neighboring components. Thus, the antenna structure 120 is electrically connected to the corresponding conductive element 115 via the connection element. In addition, the material of the connection element is different from that of the conductive element 115. Similarly, a hole 1313 is disposed on the first portion 1311 of each supporting element 131 of the antenna structure 130. The antenna structure 130 can be fixed onto the top surface of the encapsulant 110 using a connection element (e.g., solder ball) on the hole 1313 on the first portion 1311 of each supporting element 131 so as to improve the sturdiness of the electronic device 10, and the connection element will not be leaked to neighboring components, with more details described in the embodiment of FIG. 2G. In some embodiments, the connection element and the corresponding conductive element 115 can be collectively configured to function as a feed point of the antenna structure 120.

In some other embodiments, the first portion 1211 of each supporting element 121 does not have a hole 1213 thereon. Corresponding locations of the first portion 1211 of each supporting element 121 on the top surface of the encapsulant 110 can be grinded to form a cavity or recess (not shown), and the antenna structure 120 can be fixed to the top surface of the encapsulant 110 using connection elements (e.g., solder) on the cavities corresponding to each supporting element 121 so as to improve the sturdiness of the electronic device 10. Thus, the antenna structure 120 is electrically connected to the corresponding conductive element 115 via the connection element. Similarly, the first portion 1311 of each supporting elements 131 does not have a hole 1313 thereon. The corresponding locations of the first portion 1311 of each supporting element 131 on the top surface of the encapsulant 110 can be grinded to form a cavity (not shown), and the antenna structure 130 can be fixed to the top surface of the encapsulant 110 using connection elements (e.g., solder) on the cavities (or recesses) corresponding to each supporting element 131 so as to improve the sturdiness of the electronic device 10

In some embodiments, the overall length of the antenna structure 120 may start from the elevation of the substrate 112 through the corresponding conductive element 115 and corresponding supporting element 121 to the first turning point 151 toward the positive Z axis, and extends from the first turning point 151 to the second turning point 152 toward the positive Y axis, and extends further from the second turning point 152 to a third turning point 153 toward the negative X axis. The antenna structure 120 further extends from the third turning point 153 to a fourth turning point 154 toward the positive Y axis, and extends from the fourth turning point 154 to the end 155 of the antenna structure 120 toward the positive X axis. For purposes of description, the size of the encapsulant 110 is approximately 14 mm*14 mm, thickness (height) of the encapsulant 110 is approximately 1 mm, and the supporting elements 121 of the antenna structure 120 are approximately 2 mm high.

More specifically, the wavelength used by the Bluetooth™ protocol is approximately 123 mm. Given that the feed point 114 is substantially located in the middle point of a first side of the encapsulant 110 and the end 155 of the antenna structure 120 is located in the middle point of a second side, which is opposite to the first side, of the encapsulant 110, the overall length of the antenna structure 120 from the feed point 114 to the end 155 can reach ¼ wavelength of the Bluetooth's radio signal. For example, the length from the feed point 114 to the first turning point 151 is about 3 mm, and the length from the first turning point 151 to the second turning point 152 can be neglected since the first turning point 151 is very close to the second turning point 152. The length from the second turning point 152 to the third point 153 and that from the fourth turning point 154 to the end 155 are approximately 7 mm. In addition, the length from the third turning point 153 to the fourth turning point 154 is approximately 14 mm. Therefore, the overall length of the antenna structure 120 is approximately 3+7+14+7=31 mm, which is approximately ¼ wavelength of the Bluetooth's radio signal.

In an embodiment, the frequency range of the UWB protocol may be approximately between 3.1 GHz to 10.6 GHz, and thus the wavelength used by the UWB protocol may approximately range from 9 mm to 30 mm. Given that the operating frequency used by the electronic component 142 (e.g., a UWB transceiver) is 6.5 GHz, the wavelength used by the electronic component 142 is approximately 15 mm. Given that the feed point 116 is located in the middle point of a third side of the encapsulant 110, the overall length of the antenna structure 130 from the feed point 116 to two ends (e.g., ends 165 and 166) of the antenna structure 130 can reach ¼ wavelength of the UWB's radio signal. For example, when a longer wavelength is used by the electronic component 142, the length extending from the feed point 116 to the end 165 through the turning points 161, 162, 163, and 164 can be used as ¼ wavelength. When a shorter wavelength is used by the electronic component 142, the length extending from the feed point 116 to the end 166 through the turning point 161 can be used as ¼ wavelength.

It should be noted that due to size limitations of wearable or portable devices, it may be impractical to dispose U.FL connectors for the electronic components within the same encapsulant (i.e., semiconductor package). The antenna structures 120 and 130 of the present disclosure may be positioned above the top surface of the encapsulant 110 by the supporting elements 121 and 131, and thus both the upper surface and bottom surface of the antenna components of the antenna structure 120 and 130 (i.e., the U-shaped component other than the supporting elements 121 and 131) are exposed to the environment, which has a very low dielectric constant Dk (e.g., approximately equal to 1) and a very low dissipation factor Df (e.g., approximately equal to 0) compared to other common dielectric materials or substances. Thus, when the electronic component 141 emits electromagnetic waves using the antenna structure 120 and/or 130, the antenna gain of the electronic device 10 can be increased, and heat dissipation capability of the electronic device 10 enhanced in comparison with the antenna body of the antenna structures 120 or 130 being disposed on the top surface of the encapsulant 110. In addition, signal transmission loss of the electronic device 10 can be mitigated.

In some embodiments, a first resonant cavity may be formed between the bottom surface of antenna components of the antenna structure 120 or 130 (i.e., the U-shaped component other than the supporting elements 121 and 131) and the substrate 112, and the first resonant cavity may include air and the encapsulant 110. Thus, when the electronic component 141 radiates electromagnetic waves toward the encapsulant 110 by the antenna structure 120 (or 130), the radiated electromagnetic waves may first go through the air having a first dielectric constant and a first dissipation factor, and then the encapsulant 110, having a second dielectric constant and a second dissipation factor. Thus, an equivalent dielectric constant (Dk) and an equivalent dissipation factor (Df) for the electromagnetic wave radiated by the antenna structure 120 (or 130) toward the encapsulant 110 may be defined by a first dielectric constant and a first dissipation factor of air and a second dielectric constant and a second dissipation factor of the encapsulant 110, respectively.

In some embodiments, although the antenna structures 120 and 130 may be positioned above the encapsulant 110, which is a relatively small semiconductor package, the effective distance of the antenna structures 120 or 130 can still satisfy the ¼ wavelength of the electromagnetic wave radiated by the electronic components 141 or 142 so as to achieve resonance with the electromagnetic wave radiated by the electronic components 141 or 142, thereby facilitating miniaturization of the electronic device 10.

FIGS. 2A-2G are diagrams illustrating manufacture of the electronic device 10 in accordance with the embodiment of FIG. 1A. Please refer to FIG. 1A and FIGS. 2A-2G.

Figure 2A:
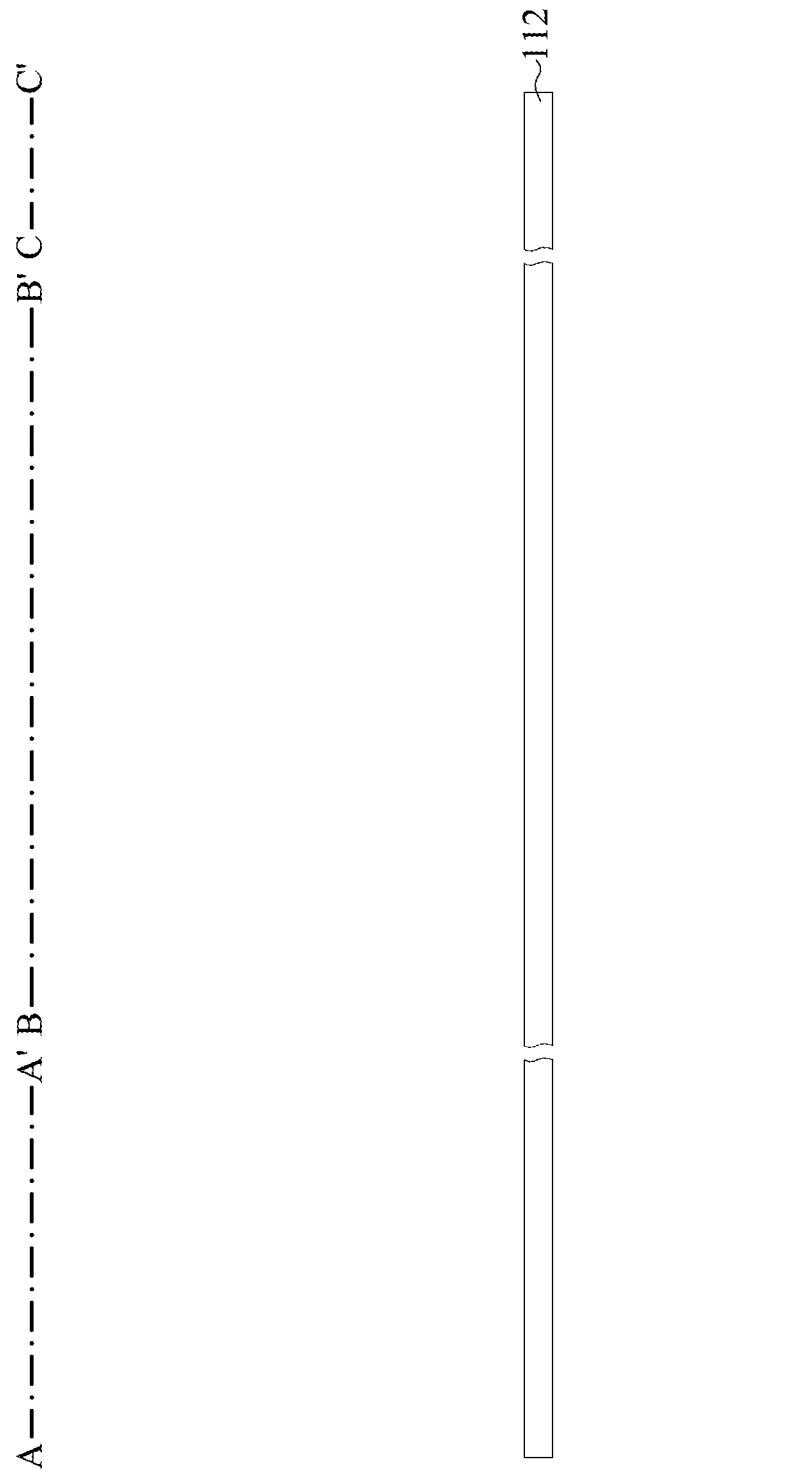
FIGS. 2A-2F are diagrams illustrating manufacture of the electronic device 10 in accordance with the embodiment of FIG. 1A.
Figure 2B:
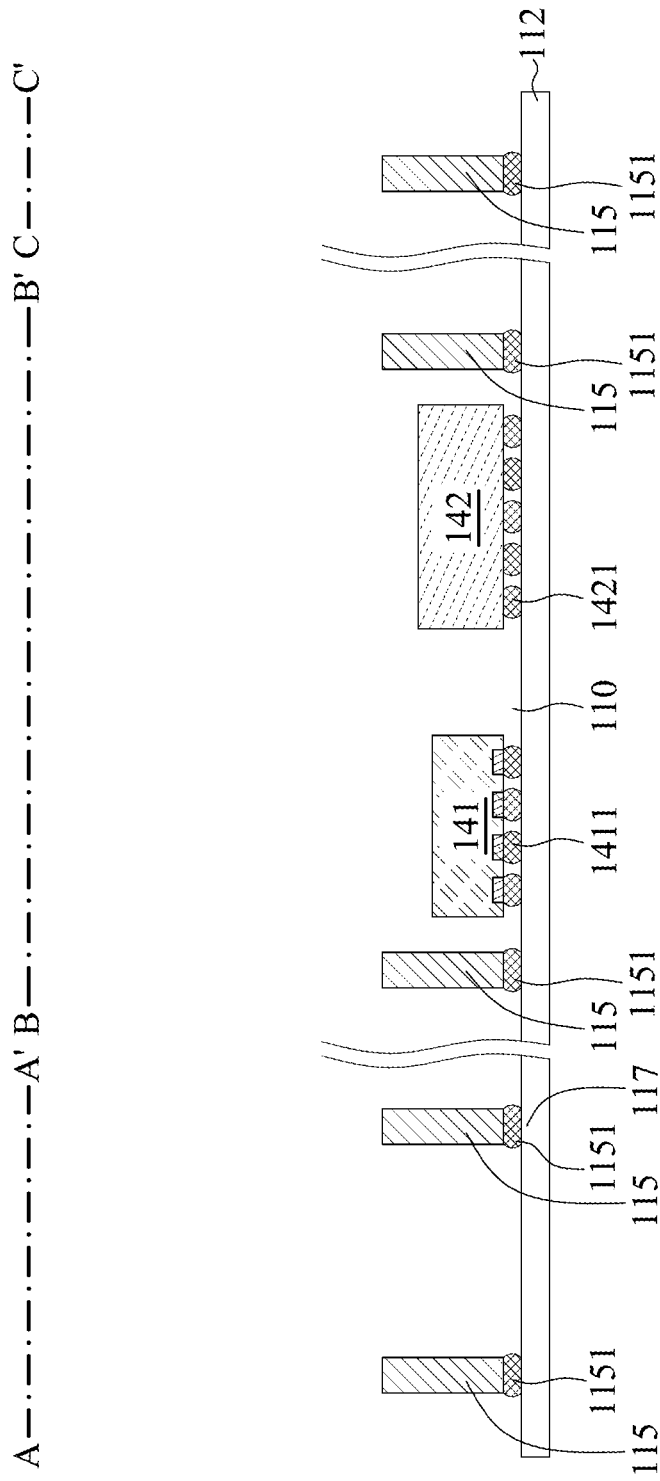

FIGS. 2A-2D and 2F-2G are cross-sectional views of the antenna device 10 along line AA', curve BB', and line CC' in FIG. 1A. During manufacture of the electronic device 10, the substrate 112 is first obtained, as shown in FIG. 2A. Then, the electronic components 141 and 142 and the conductive elements 115 are disposed on the substrate 112 through respective connection elements 1411, 1421, and 1151, and the height of the conductive elements 115 exceeds that of the electronic components 141 and 142, as shown in FIG. 2B. The connection elements 1411, 1421, and 1511 may be solder balls, interposers, bump pads, or any other type of interconnection component, and may be implemented using metals such as copper, gold, aluminum, etc., but the present disclosure is not limited thereto. It should be noted that the layout placement of the electronic components 141 and 142 and the conductive elements 115 shown in FIG. 2B is an example for illustration, but the present disclosure is not limited thereto.

Figure 2C:
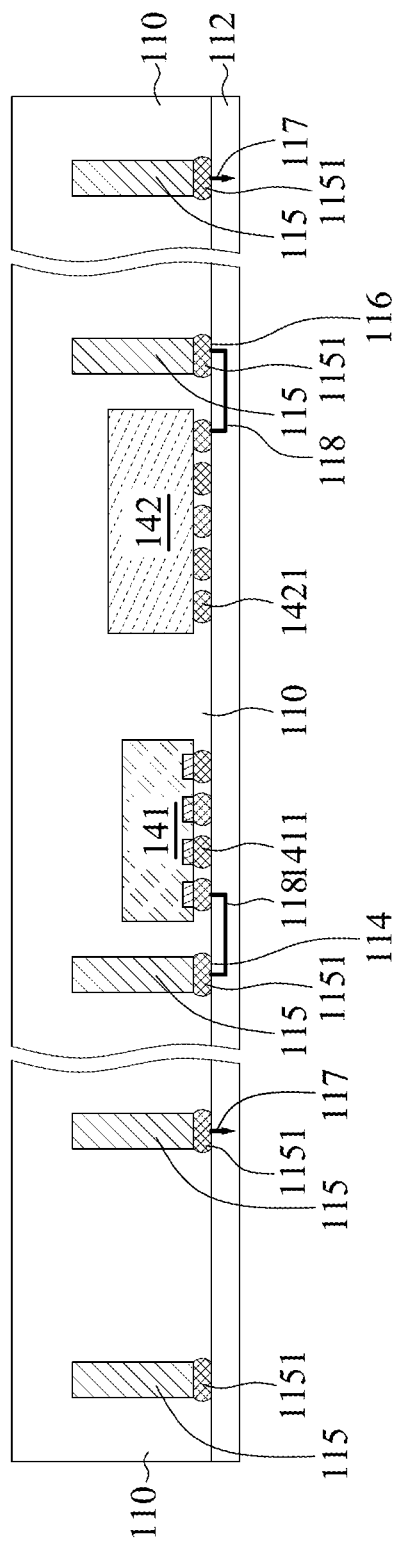

In FIG. 2C, the encapsulant 110 is formed on the substrate 112, electronic components 141 and 142, and the conductive elements 115 to encapsulate the components. For example, the encapsulant 110 may be a molding compound such as an epoxy resin, a phenolic hardener, a silica, a catalyst, a pigments, or a mold release agent, but the present disclosure is not limited thereto. The conductive element 115 at point B may be electrically connected to the electronic component 141 through the feed point 114 and the redistribution layer (RDL) 118 of the substrate 112, and the conductive element 115 at point B' may also be electrically connected to the electronic component 142 through the feed point 116 and the redistribution layer 118 of the substrate 112. In addition, the conductive element 115 at point A' may be a grounding element electrically connected to the ground element (or ground layer) 117 of the substrate 112, and the conductive element 115 at point C may also be a grounding element electrically connected to the ground element 117 of the substrate 112. For brevity, the ground element 117 and the redistribution layer 118 are not shown in FIGS. 2A-2B.

Figure 2D:
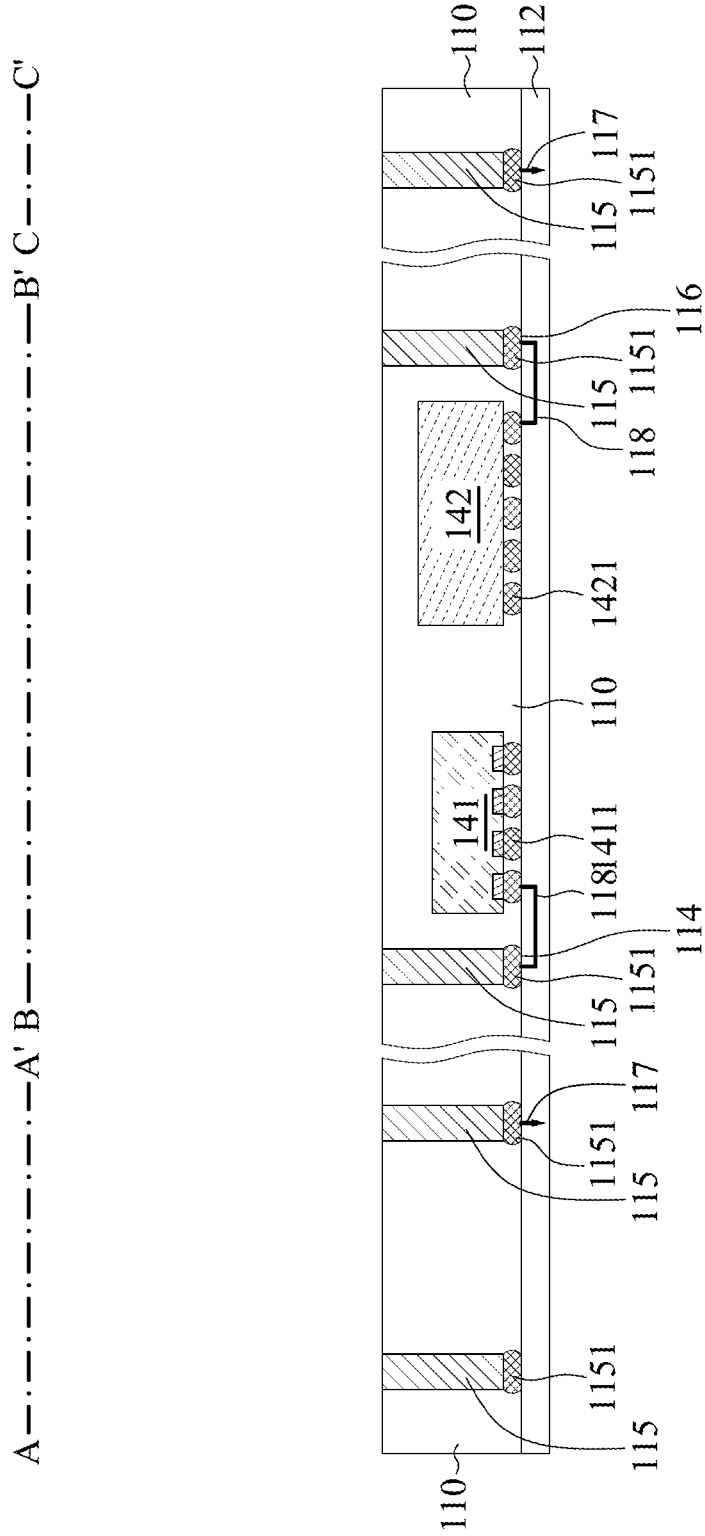
Figure 2E:
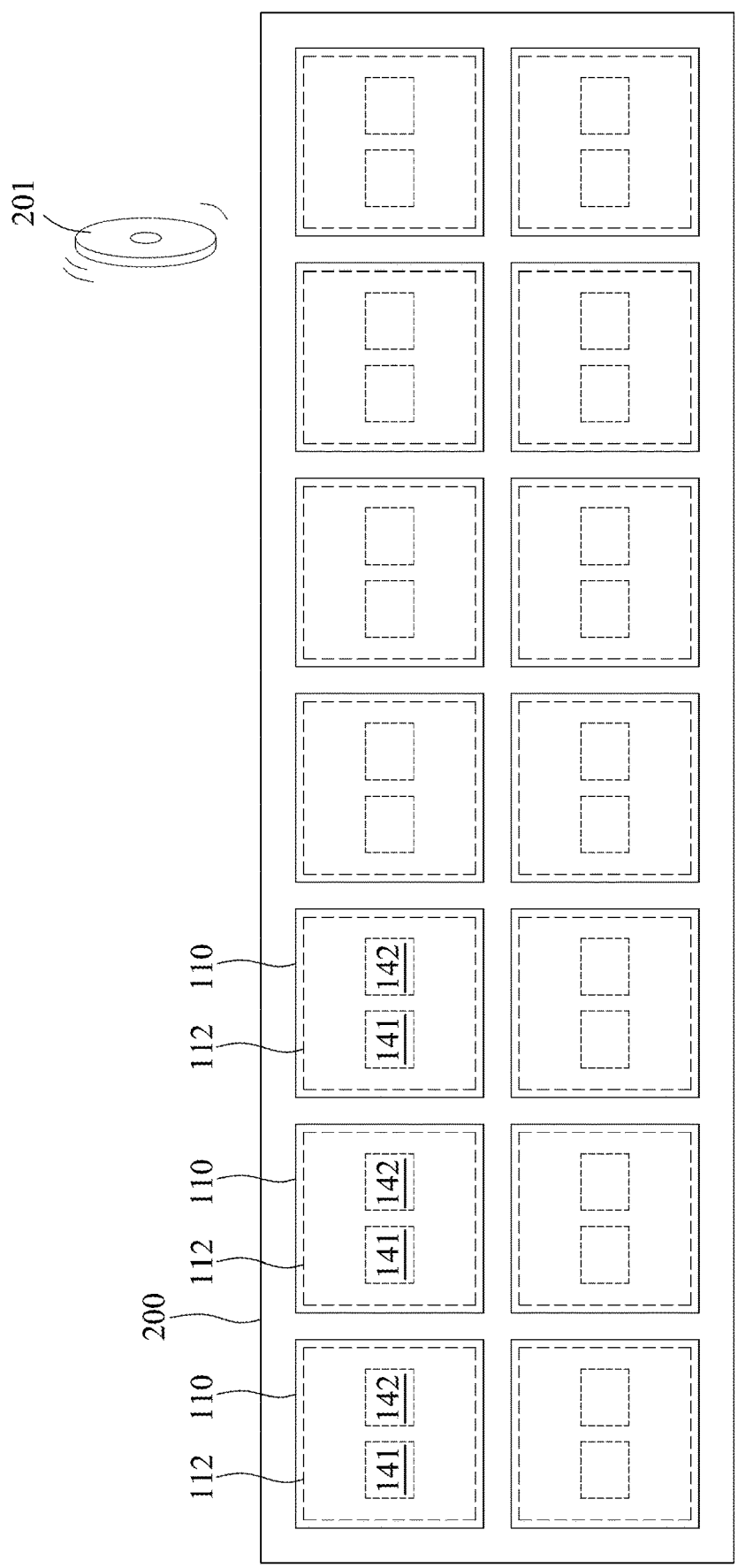

In FIG. 2D, a strip grinding process is performed on the encapsulant 110 to reduce thickness thereof, exposing a top surface of each conductive element 115 to air. In other words, each conductive element 115 is partially encapsulated by the encapsulant 110, and the top surface each conductive element 115 is substantially coplanar with the top surface of the encapsulant 110. It should be noted that the substrate 112 of the electronic device 10 may be a portion of a substrate 200 shown in FIG. 2E. In other words, the substrate 200 may include a plurality of substrates 112, each having electronic components 141 and 142 (and the conductive elements 115, which are not shown in FIG. 2E) disposed thereon. Each substrate 112 and the corresponding electronic components 141 and 142 are encapsulated by the encapsulant 110 to form a semiconductor package, and the substrate 200 is cut by a cutting element (e.g., a diamond saw or blade saw) 201 to separate the semiconductor packages, as shown in FIG. 2E.

Figure 2F:
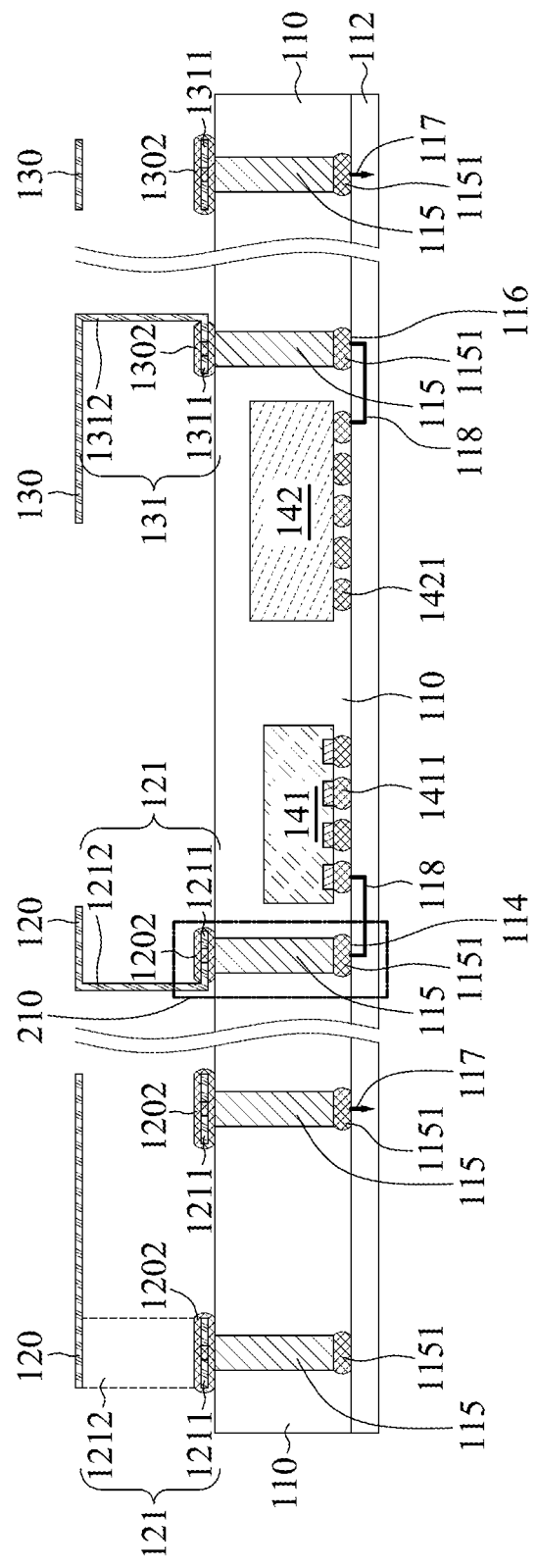

In FIG. 2F, the antenna structure 120 is attached to the encapsulant 110 by forming a connection element 1202 between each first portion 1211 of the antenna structure 120 and the corresponding conductive element 115. It should be noted that one of the conductor elements 115 functions as or is connected to the feed point, so that the antenna structure 120 can be electrically connected to the electronic component 141, and the other conductor elements 115 associated with the antenna structure 120 may include non-electrical function. The antenna structure 130 can be attached to the encapsulant 110 by forming a connection element 1302 between each first portion 1311 of the antenna structure 130 and the corresponding conductive element 115 in a similar manner, and the other conductor elements 115 associated with the antenna structure 130 may include non-electrical function. After the processing shown in FIG. 2F, manufacture of the electronic device 10 is complete.

Figure 2G:
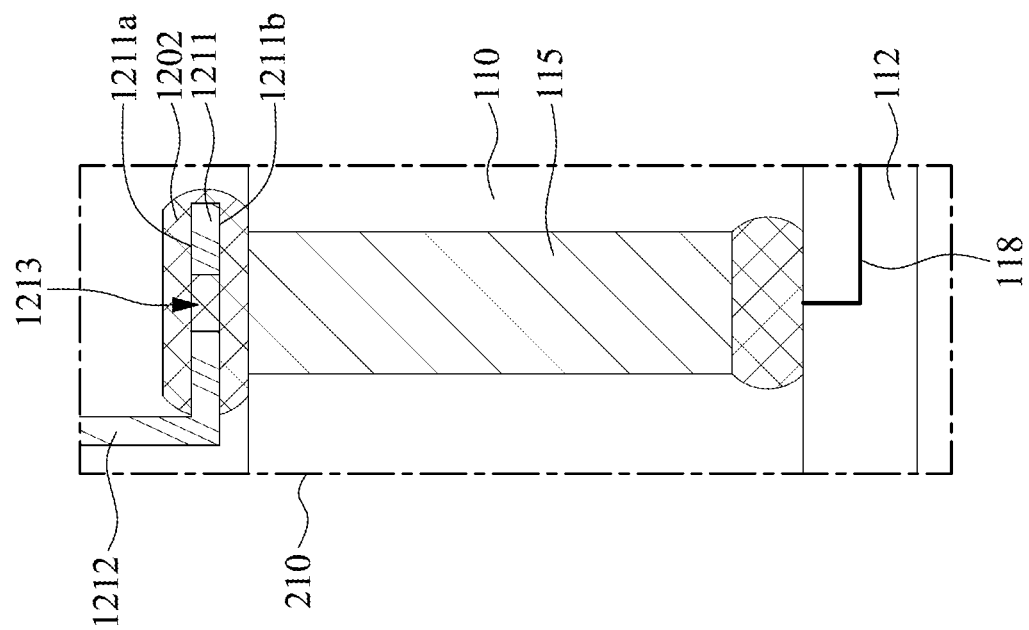
FIG. 2G is another cross-sectional view around the region around the supporting element 121 connected to the corresponding conductive element 115 in accordance with the embodiment of FIG. 2F.

FIG. 2G is an enlarged view of region 210 in FIG. 2F. For example, the connection element 1202 may extend from a top surface 1211a to a bottom surface 1211b of the first portion 1211 of the antenna structure through the hole 1213, thereby connecting the supporting element 121 to the corresponding conductive element 115. It should be noted that FIG. 2F is for illustrating how the antenna structure 120 is attached to the encapsulant 110, and it may not represent the precise cross-section of the antenna device 10 shown in FIG. 1A.

Figure 3A:
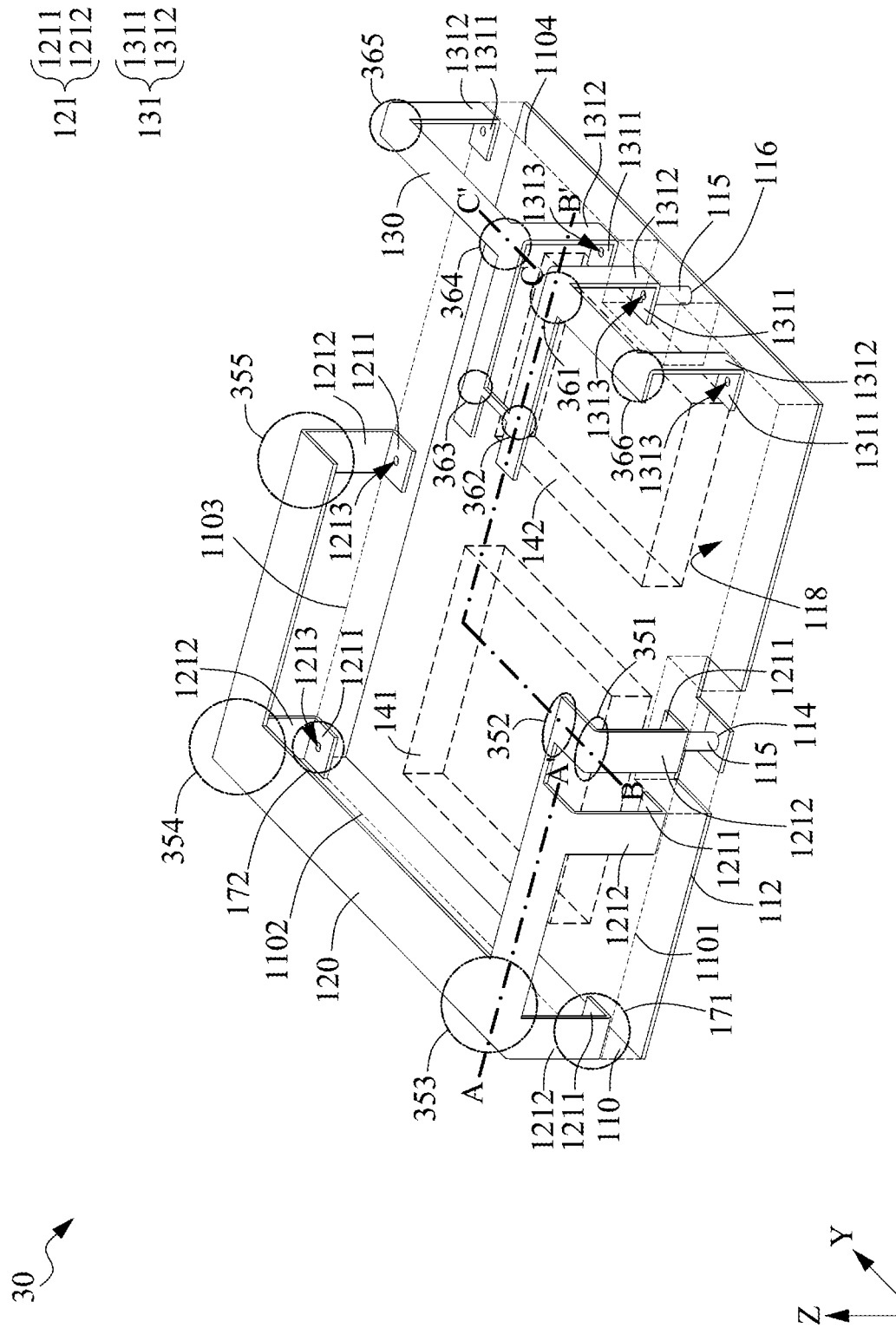
FIG. 3A is a perspective view of an electronic device 30 in accordance with another embodiment of the present disclosure.
Figure 3B:
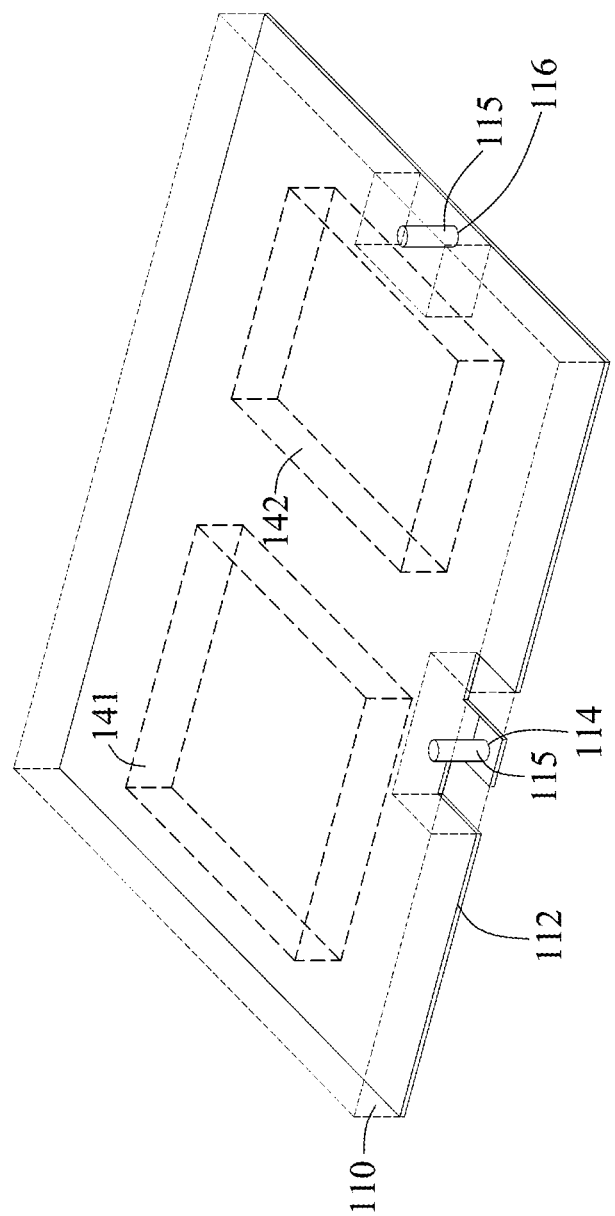
FIG. 3B is a perspective view the encapsulant 110 of the electronic device 30 in accordance with the embodiment of FIG. 3A.
Figure 3C:
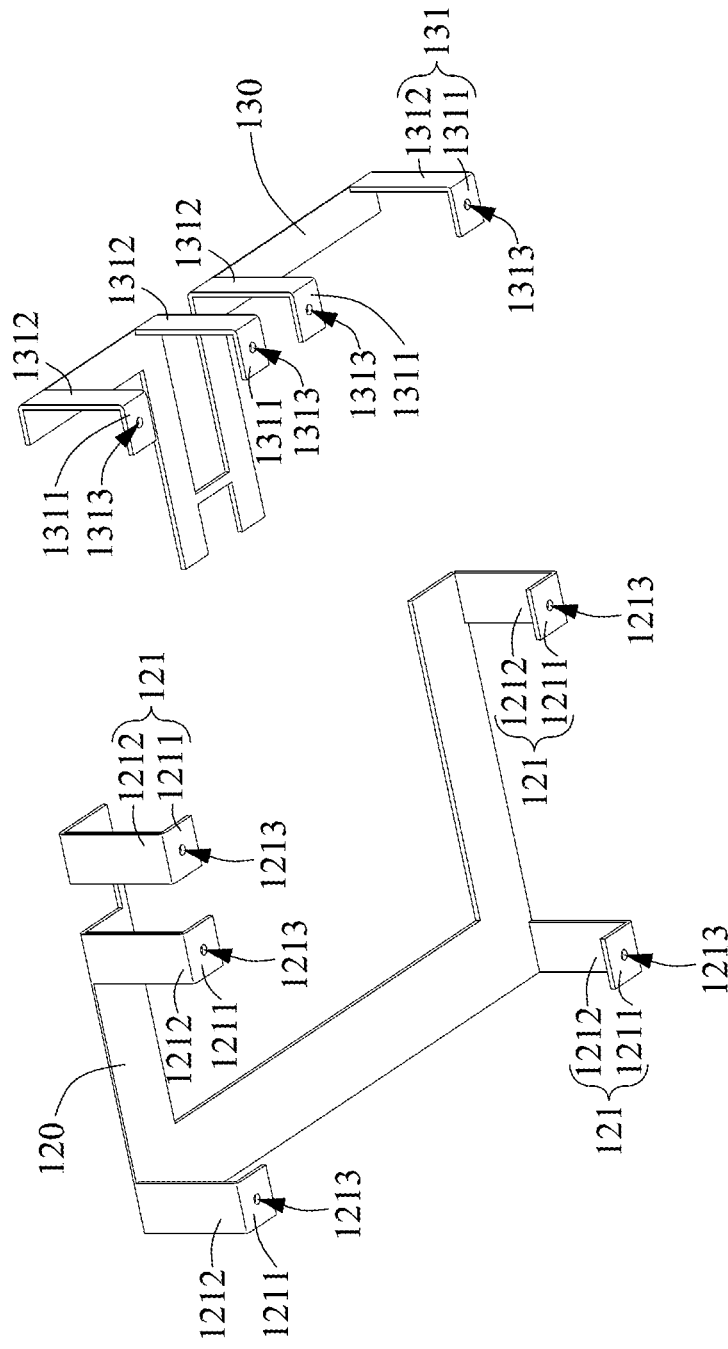
FIG. 3C is a perspective view of antenna structures 120 and 130 of the electronic device 30 in accordance with the embodiment of FIG. 3A.

FIG. 3A is a perspective view of an electronic device 30 in accordance with another embodiment of the present disclosure. FIG. 3B is a perspective view the encapsulant 110 of the electronic device 30 in accordance with the embodiment of FIG. 3A. FIG. 3C is a perspective view of antenna structures 120 and 130 of the electronic device 30 in accordance with the embodiment of FIG. 3A. Please refer to FIGS. 3A-3C.

The electronic device 30 shown in FIG. 3A is similar to the electronic device 10 shown in FIG. 1A, with the difference therebetween that two conductive elements 115 are disposed on the substrate 112, as shown in FIG. 3B. One conductive element 115 can electrically connect the antenna structure 120 to the electronic component 141, and the other conductive element 115 can electrically connect the antenna structure 130 to the electronic component 142. In addition, the antenna structures 120 and 130 shown in FIG. 3C are similar to those shown in FIG. 1B.

Specifically, one of the supporting elements 121 of the antenna structure 120 is electrically connected to the electronic component 141 through the corresponding conductive element 115 and the feed point 114, and one of the supporting elements 131 of the antenna structure 130 is electrically connected to the electronic component 142 through the corresponding conductive element 115 and the feed point 116. It should be noted that the remaining supporting elements 121 and 131 not connected to the conductive element 115, are attached to the top surface of the encapsulant 110 by forming corresponding connection elements (e.g., solder) therebetween. In some embodiments, the remaining supporting elements 121 and 131 may directly contact with the encapsulant 110 without using any connection elements therebetween, and they may be used to support the antenna structures 120 and 130 on the encapsulant 110.

FIGS. 4A-4I are diagrams illustrating manufacture of the electronic device 10 in accordance with the embodiment of FIG. 3A. Please refer to FIG. 3A and FIGS. 4A-4I.

The flow in FIGS. 4A to 4E is similar to that in FIGS. 2A to 2E, with the difference therebetween that two conductive elements 115 are disposed on the substrate 112 in FIGS. 4A-4E. The conductive element 115 (e.g., a feed point for the electronic component 141) at point B is electrically connected to the electronic component 141, and the conductive element 115 (e.g., a feed point for the electronic component 142) at point B' is electrically connected to the electronic component 142.

Figure 4A:
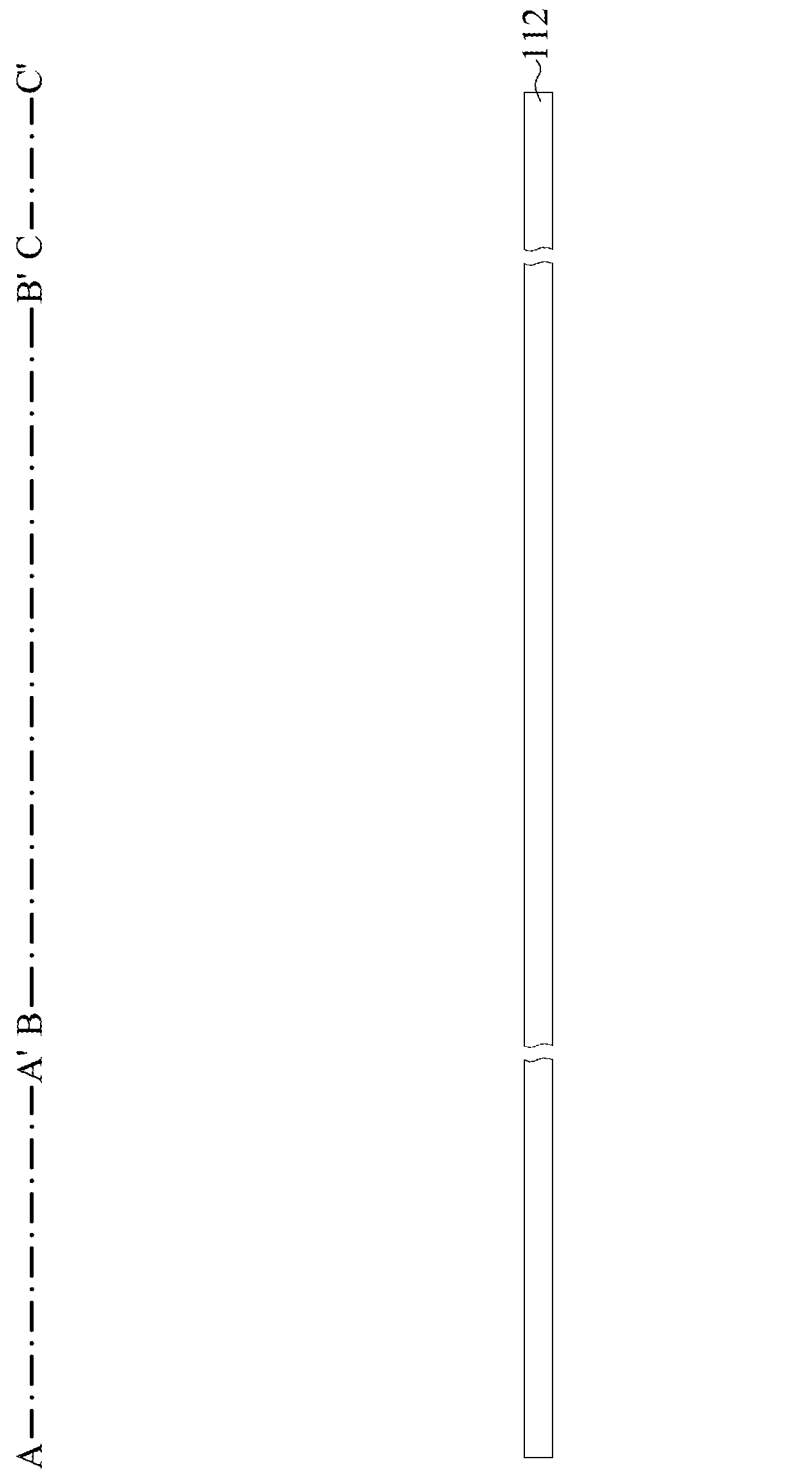
FIGS. 4A-4I are diagrams illustrating manufacture of the electronic device 30 in accordance with the embodiment of FIG. 3A.
Figure 4B:
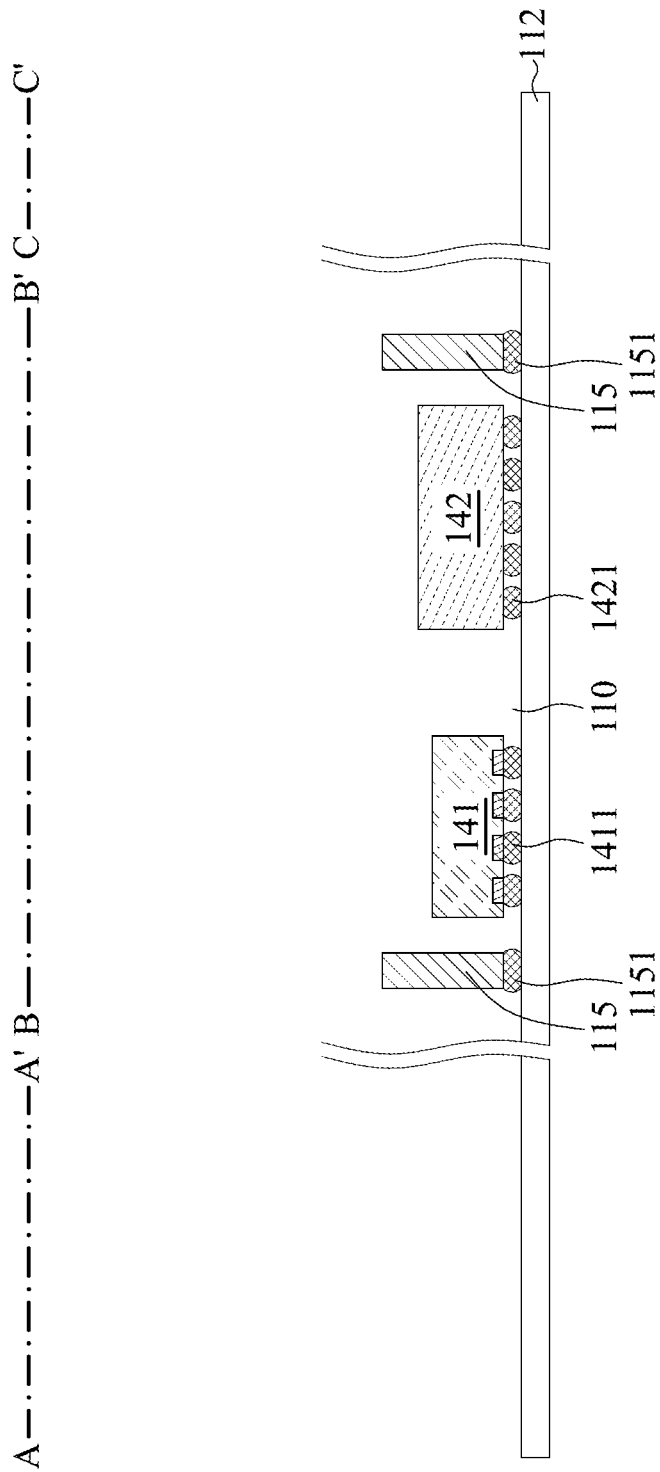
Figure 4C:
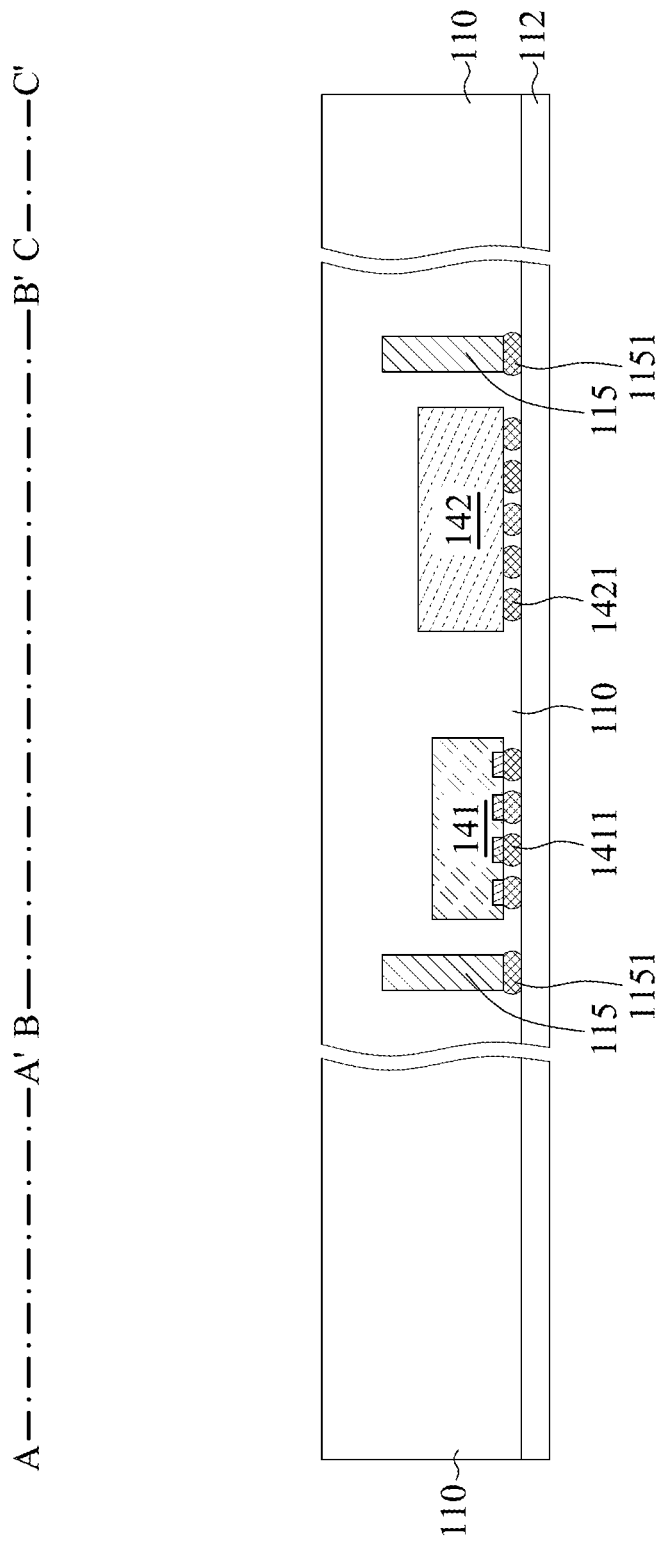
Figure 4D:
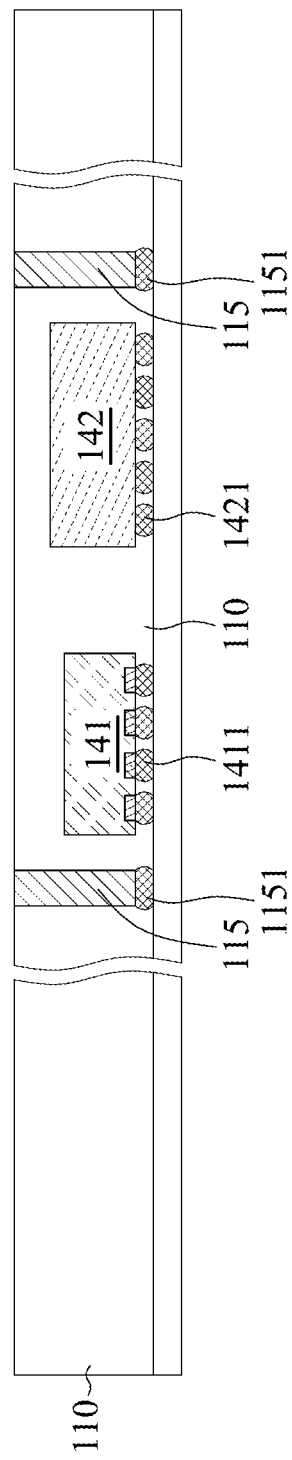
Figure 4E:
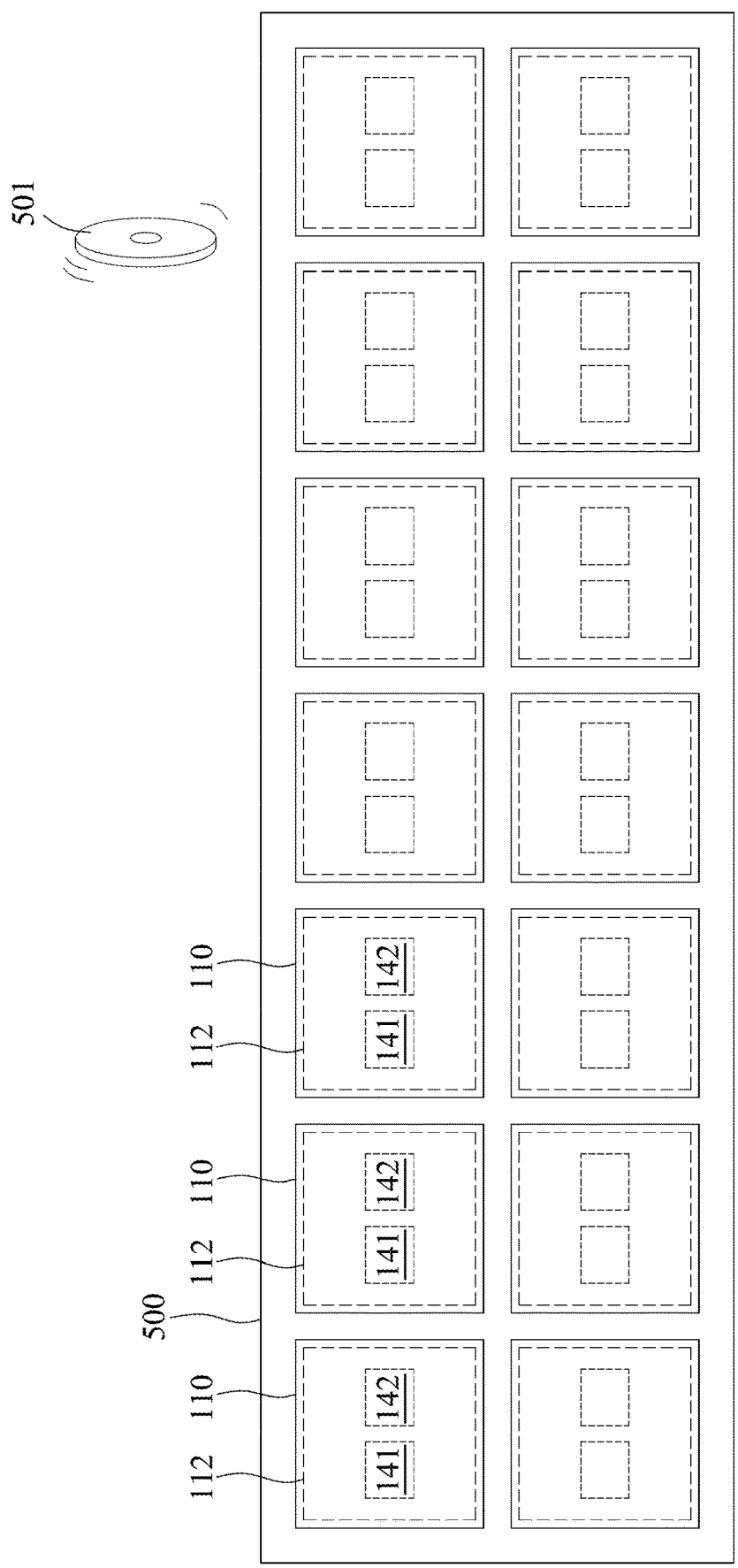
Figure 4F:
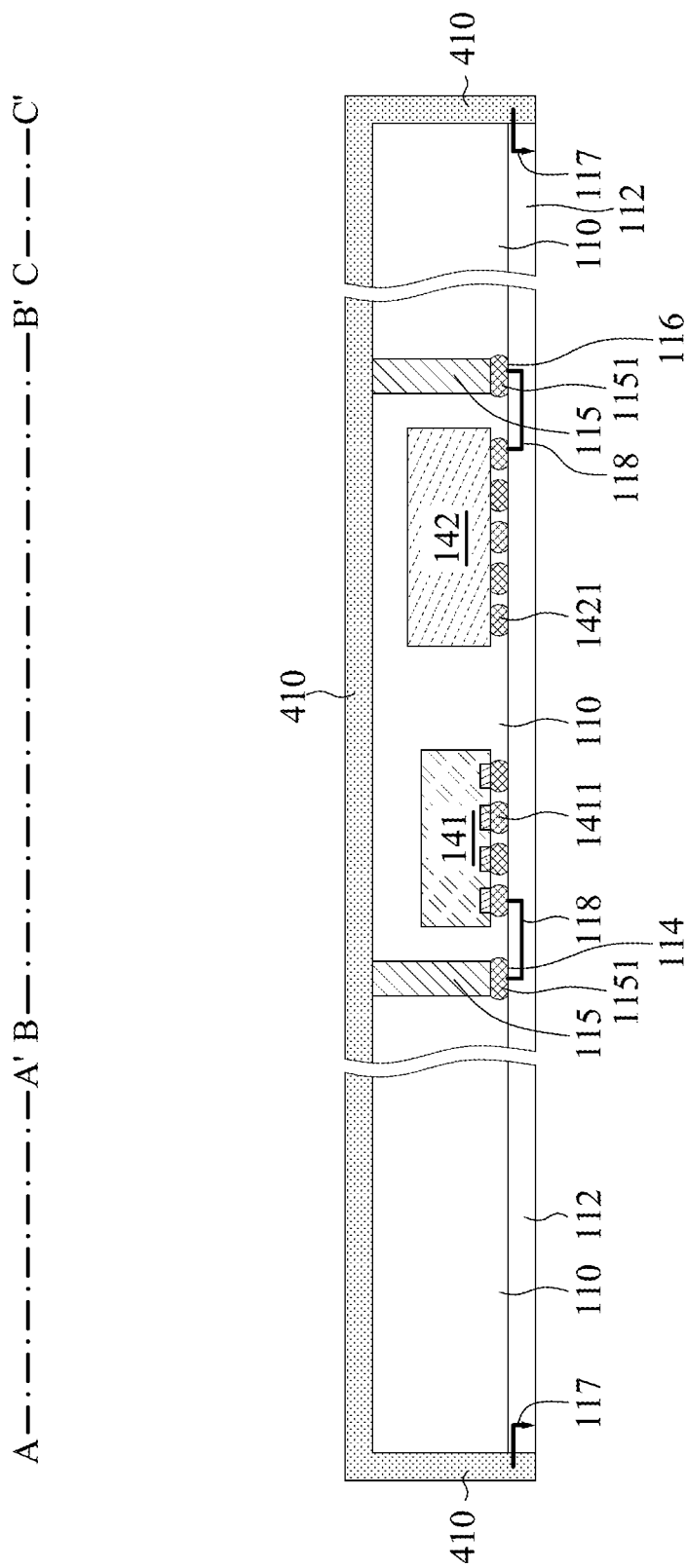
Figure 4G:
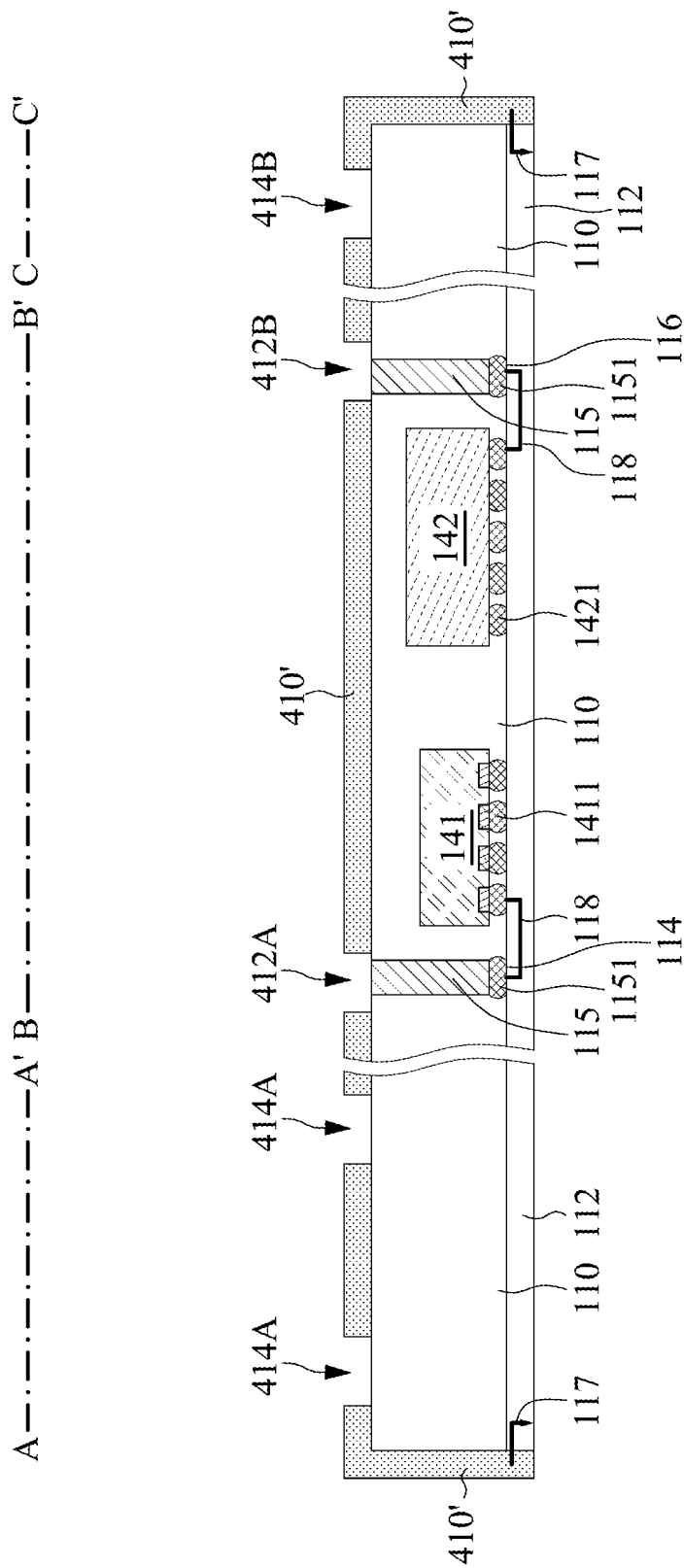

Following FIG. 4E, a physical vapor deposition (PVD) process is performed on the encapsulant 110, and a conductive layer 410 is formed on the encapsulant 110, as shown in FIG. 4F. In addition, the conductive layer 410 may have a thickness above the top surface of the encapsulant 110. For example, the conductive layer 410 may be connected to the ground element (or ground layer) 117 of the substrate 112 which protrudes from the lateral surface of the substrate 112, and thus the conductive layer 410 may be regarded as a ground layer. In addition, the conductive player 410 may also be regarded as a shielding layer to block interferences from external electromagnetic waves to the electronic components 141 and 142. For brevity, the ground element 117 and the redistribution layer 118 are not shown in FIGS. 4A-4D. After, laser ablation is performed on the conductive layer 410. Holes 412A and 412B are formed between the remaining conductive layer 410' and the top surface of the conductive element 115, and holes 414A and 414B are formed between the remaining conductive layer 410' and the top surface of the thinned encapsulant 110, as shown in FIG. 4G. It should be noted that holes 414A may be for the remaining supporting elements 121 of the antenna structure 120 not connected to the corresponding conductive element 115 (e.g., at point B), and the hole 414B may be for the remaining supporting elements 131 of the antenna structure 130 not connected to the corresponding conductive element 115 (e.g., at point B').

Figure 4H:
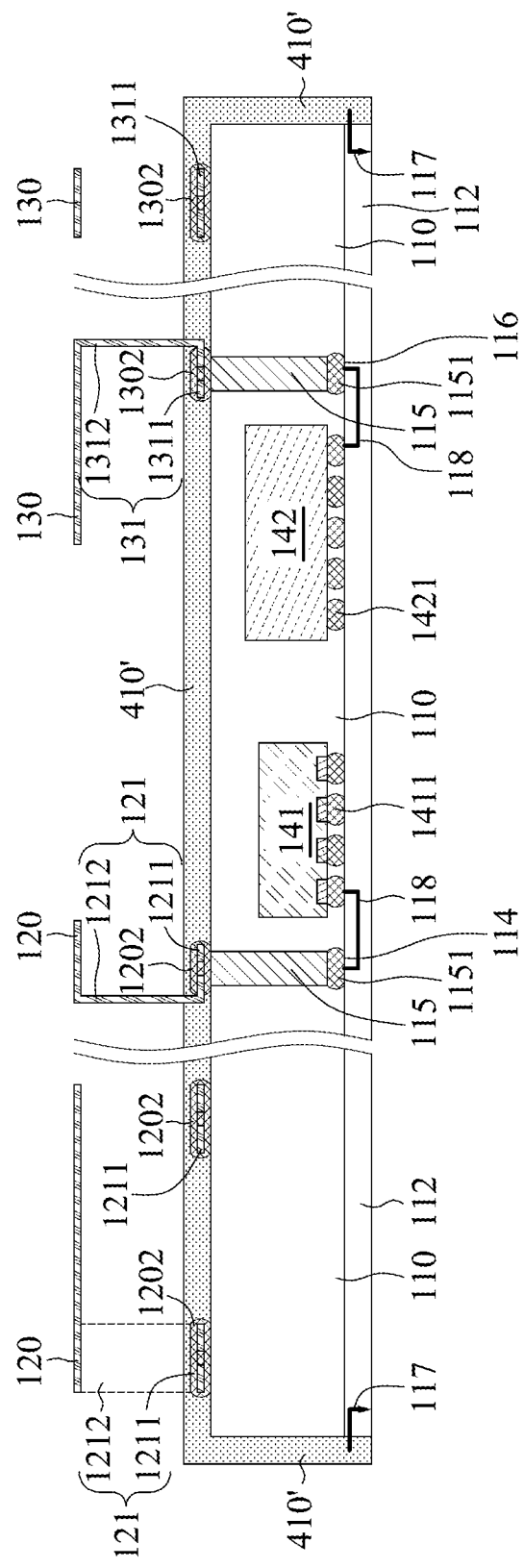
Figure 4I:
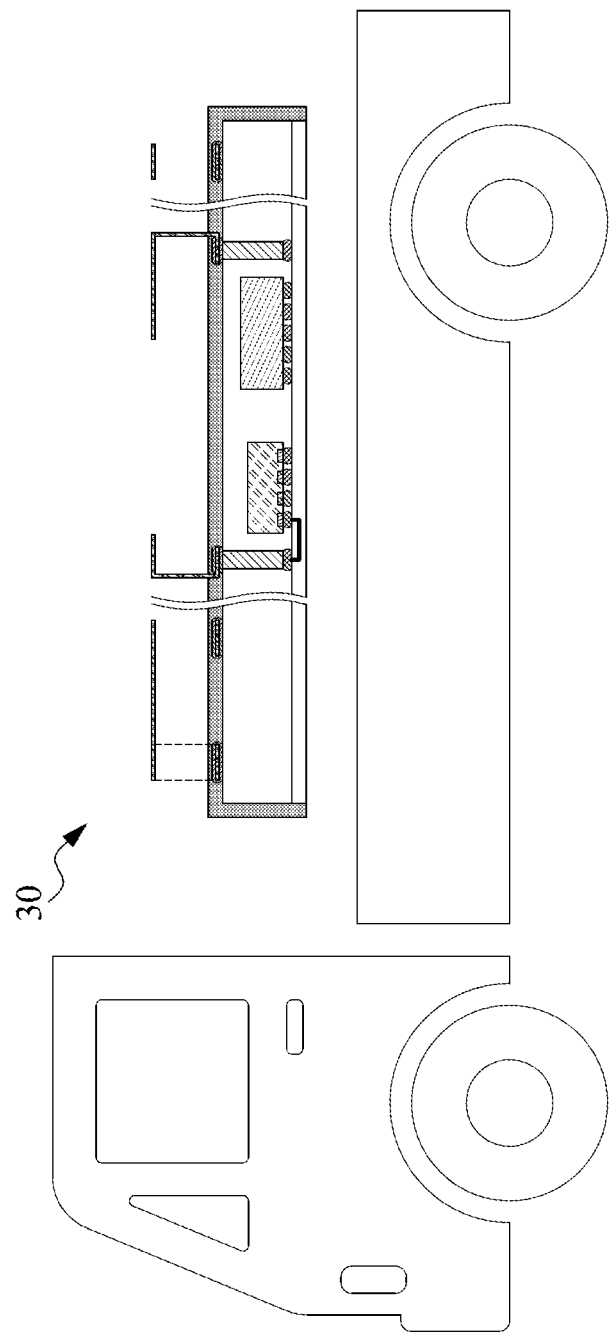

After laser ablation on the conductive layer 410 is performed, the antenna structure 120 can be attached to the thinned encapsulant 110 by placing the supporting elements 121 on the corresponding holes 412A and 414A via corresponding connection elements 1202 extending from the bottom surface to the top surface of the first portion 1211 of each supporting element 121, as shown in FIG. 4H. Similarly, the antenna structure 130 can be attached to the thinned encapsulant 110 by placing the supporting elements 131 on the corresponding holes 412B and 414B via corresponding connection elements 1302 extending from the bottom surface to the top surface of the first portion 1311 of each supporting element 131. Thus, manufacture of the electronic device 30 is complete, and the electronic device 30 may be ready for shipping, as shown in FIG. 4I. It should be noted that FIGS. 4F to 4H are for illustrating how the antenna structure 120 is attached to the encapsulant 110, and it may not represent the precise cross-section of the electronic device 30 shown in FIG. 3A.

Figure 5A:
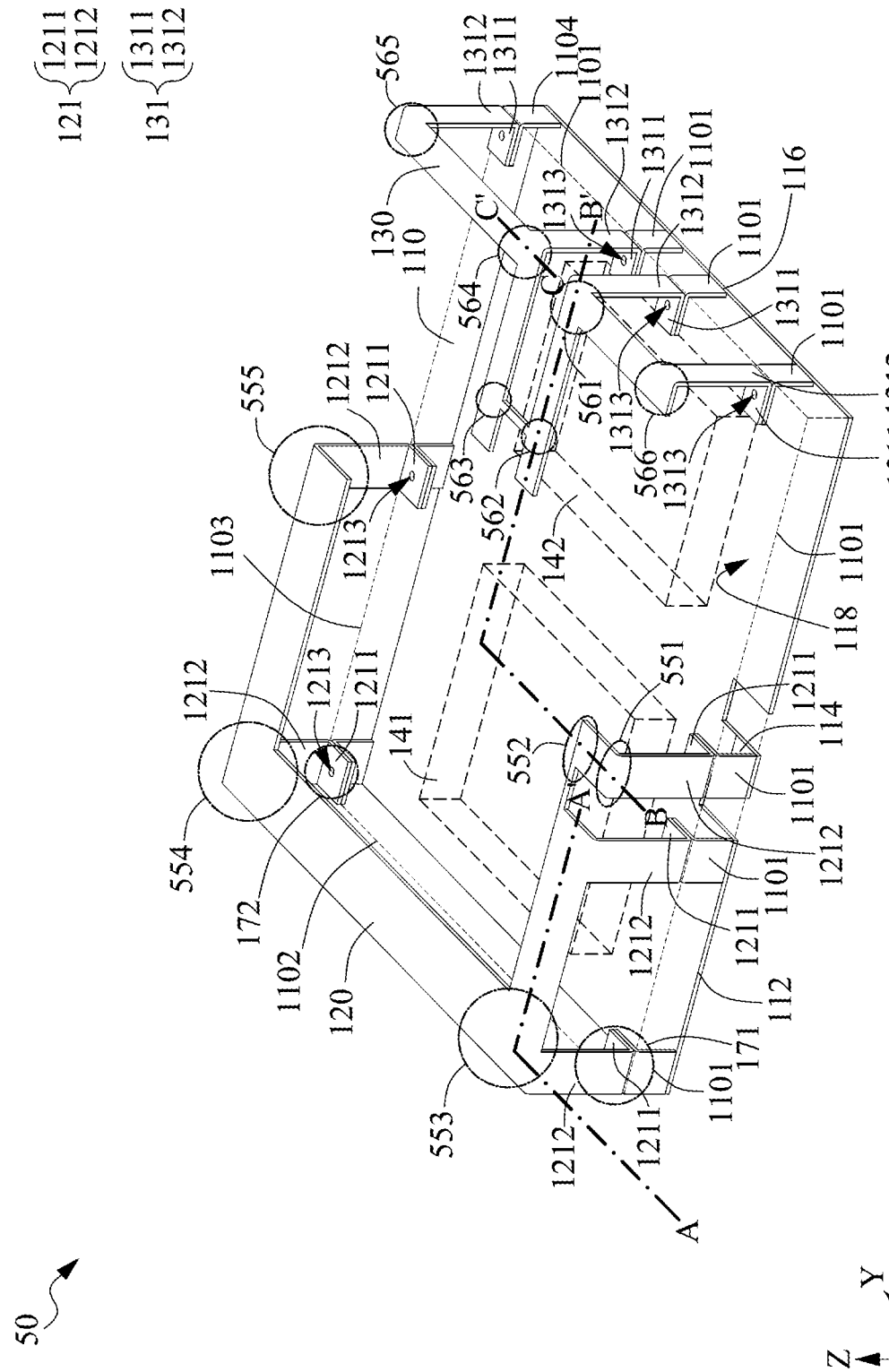
FIG. 5A is a perspective view of an electronic device 50 in accordance with another embodiment of the present disclosure.
Figure 5B:
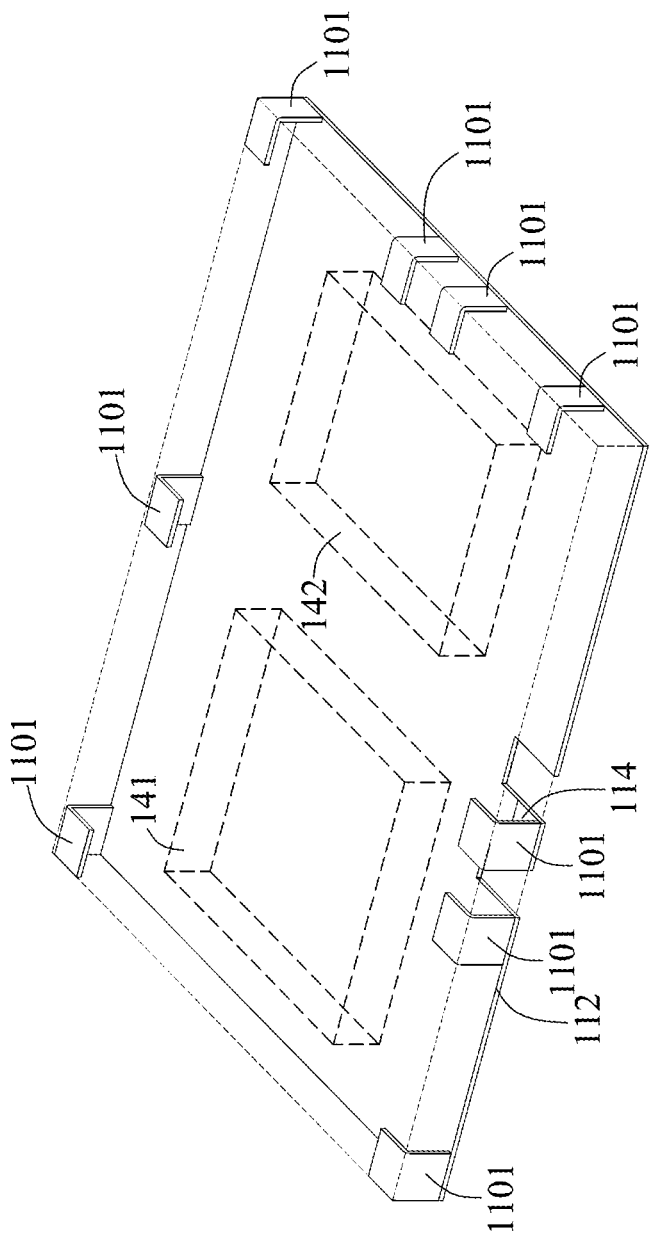
FIG. 5B is a perspective view the encapsulant 110 of the electronic device 50 in accordance with the embodiment of FIG. 5A.
Figure 5C:
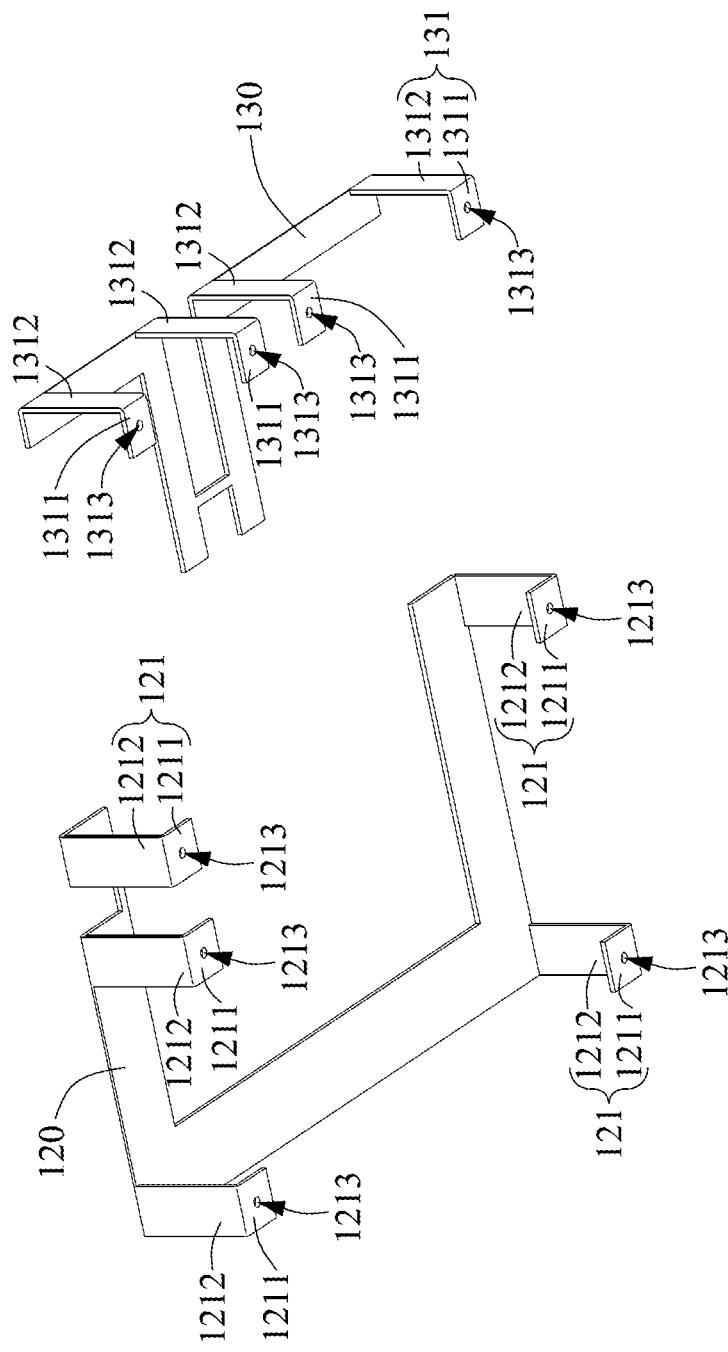
FIG. 5C is a perspective view of antenna structures 120 and 130 of the electronic device 50 in accordance with the embodiment of FIG. 5A.

FIG. 5A is a perspective view of an electronic device 50 in accordance with another embodiment of the present disclosure. FIG. 5B is a perspective view the encapsulant 110 of the electronic device 50 in accordance with the embodiment of FIG. 5A. FIG. 5C is a perspective view of antenna structures 120 and 130 of the electronic device 50 in accordance with the embodiment of FIG. 5A. Please refer to FIGS. 5A-5C.

The electronic device 50 shown in FIG. 5A is similar to the electronic device 10 shown in FIG. 1A, with the difference therebetween that a plurality of conductive elements 1101 (e.g., sputters) are formed on the surfaces of the encapsulant 110 (e.g., via a physical vapor deposition (PVD) process), as shown in FIG. 5B. One of the conductive elements 1101 may be connected to the feed point 114 of the electronic component 141, and can electrically connect the antenna structure 120 to the electronic component 141. Another conductive element 1101 may be electrically connected to the feed point 116 electrically connecting the antenna structure 130 to the electronic component 142. In addition, the antenna structures 120 and 130 shown in FIG. 5C are similar to those shown in FIG. 1B.

Specifically, one of the supporting elements 121 of the antenna structure 120 is electrically connected to the electronic component 141 through the corresponding conductive element 1101 and the feed point 114, and one of the supporting elements 131 of the antenna structure 130 is electrically connected to the electronic component 142 through the corresponding conductive element 1101 and the feed point 116. It should be noted that the remaining supporting elements 121 and 131 not connected to the conductive element 115 are attached to the top surface of the encapsulant 110 by forming corresponding connection elements (e.g., solder) extending from the bottom surface to the top surface of each of the supporting element 121 and 131.

FIGS. 6A-6H are diagrams illustrating manufacture of the electronic device 50 in accordance with the embodiment of FIG. 5A. Please refer to FIG. 5A and FIGS. 6A-6H.

The flow in FIGS. 6A to 6D is similar to that in FIGS. 2A to 2E, with the difference therebetween that no conductive elements 115 are disposed on the substrate 112. In addition, in FIG. 6E, a physical vapor deposition (PVD) process is performed on the encapsulant 110 to form a conductive layer 610 thereon, and the conductive layer 610 may include a conductive material.

Figure 6A:
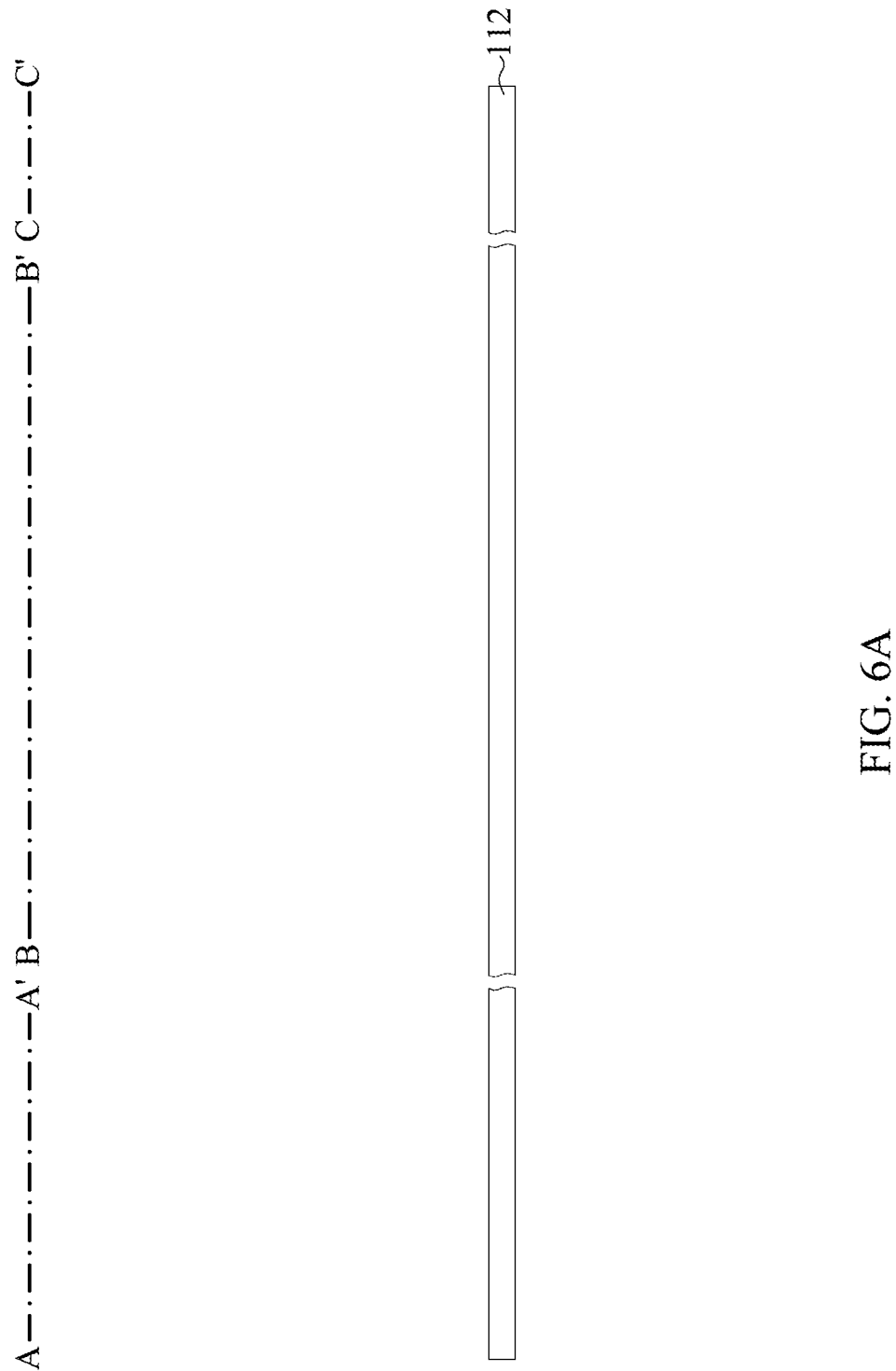
FIGS. 6A-6H are diagrams illustrating manufacture of the electronic device 50 in accordance with the embodiment of FIG. 5A.
Figure 6B:
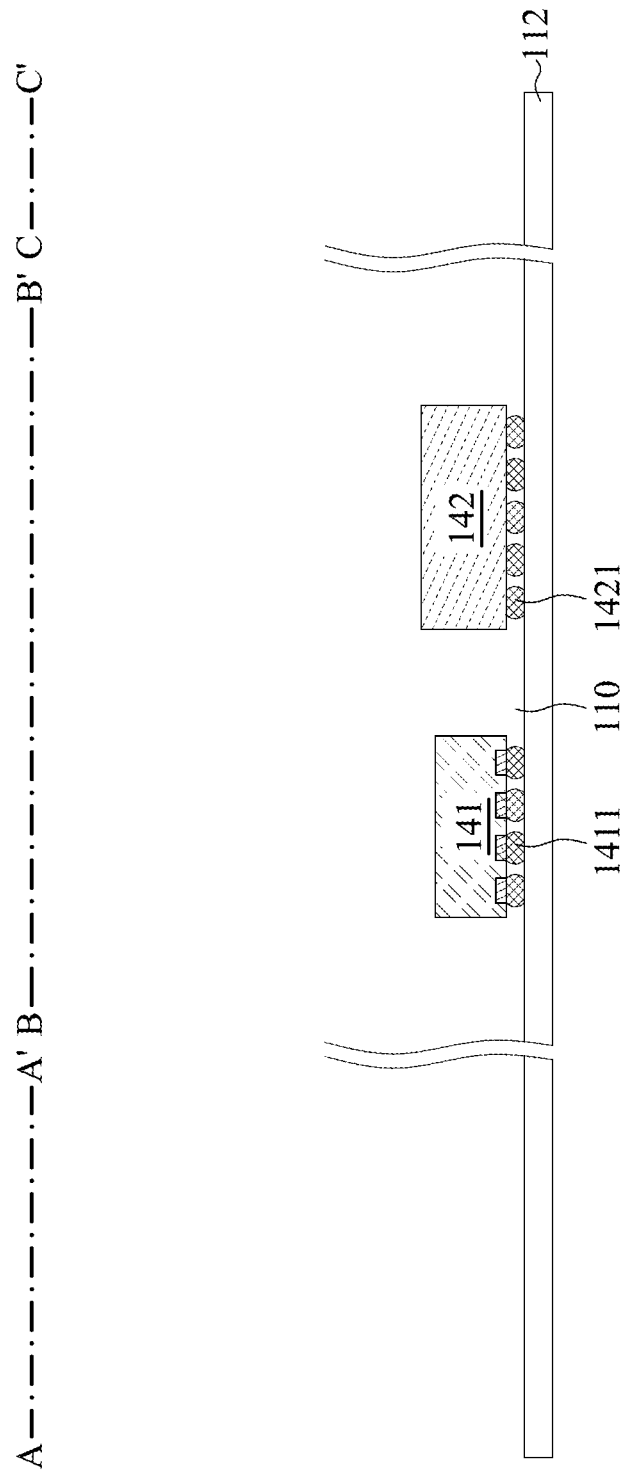
Figure 6C:
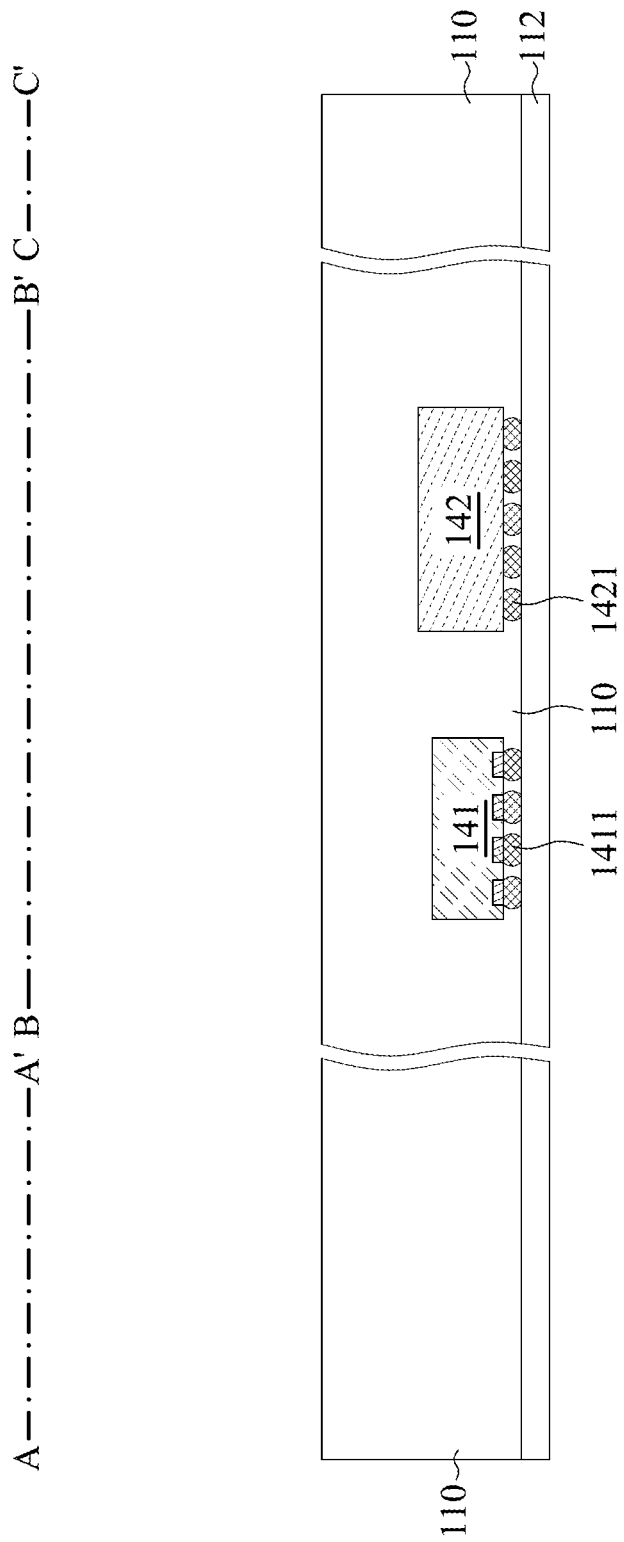
Figure 6D:
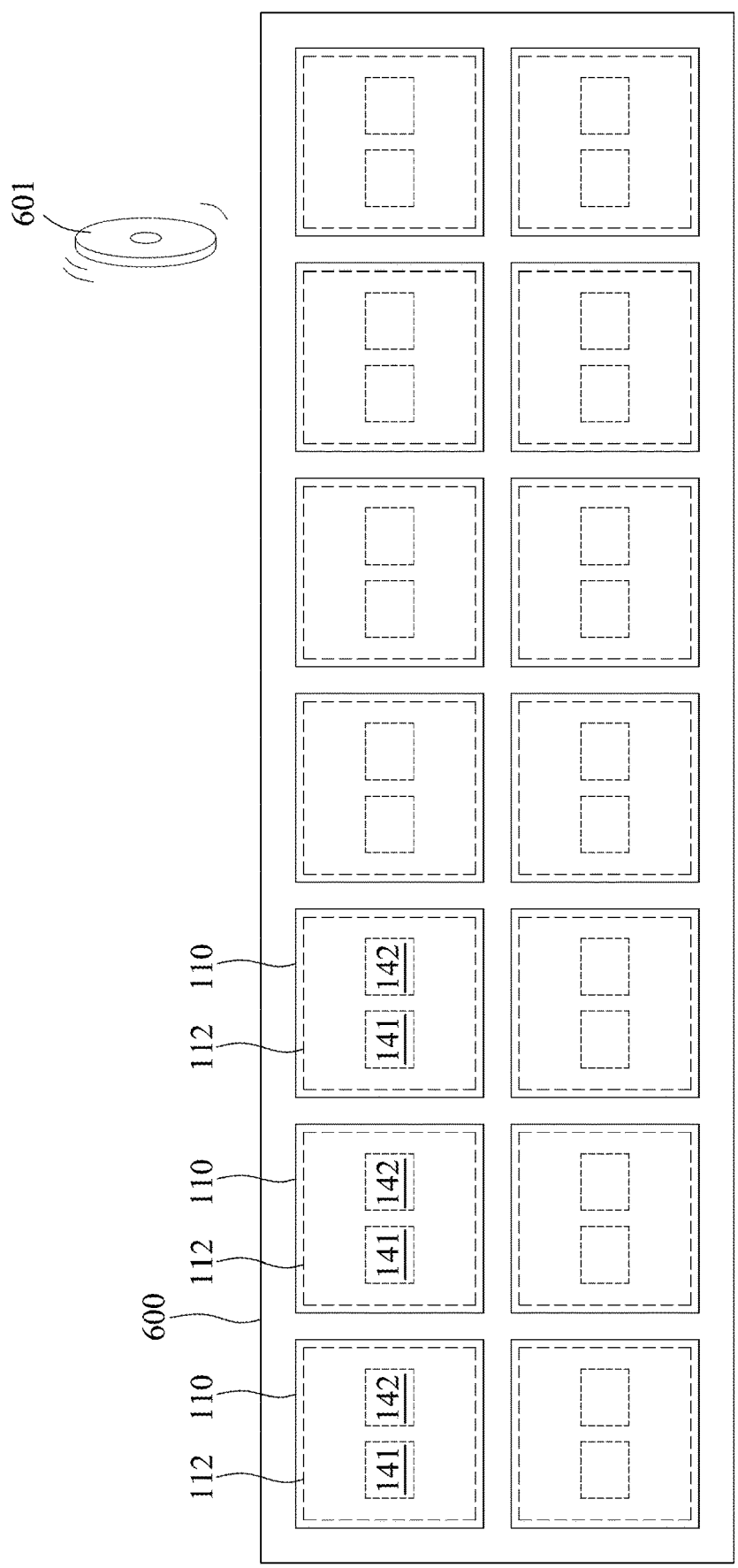
Figure 6E:
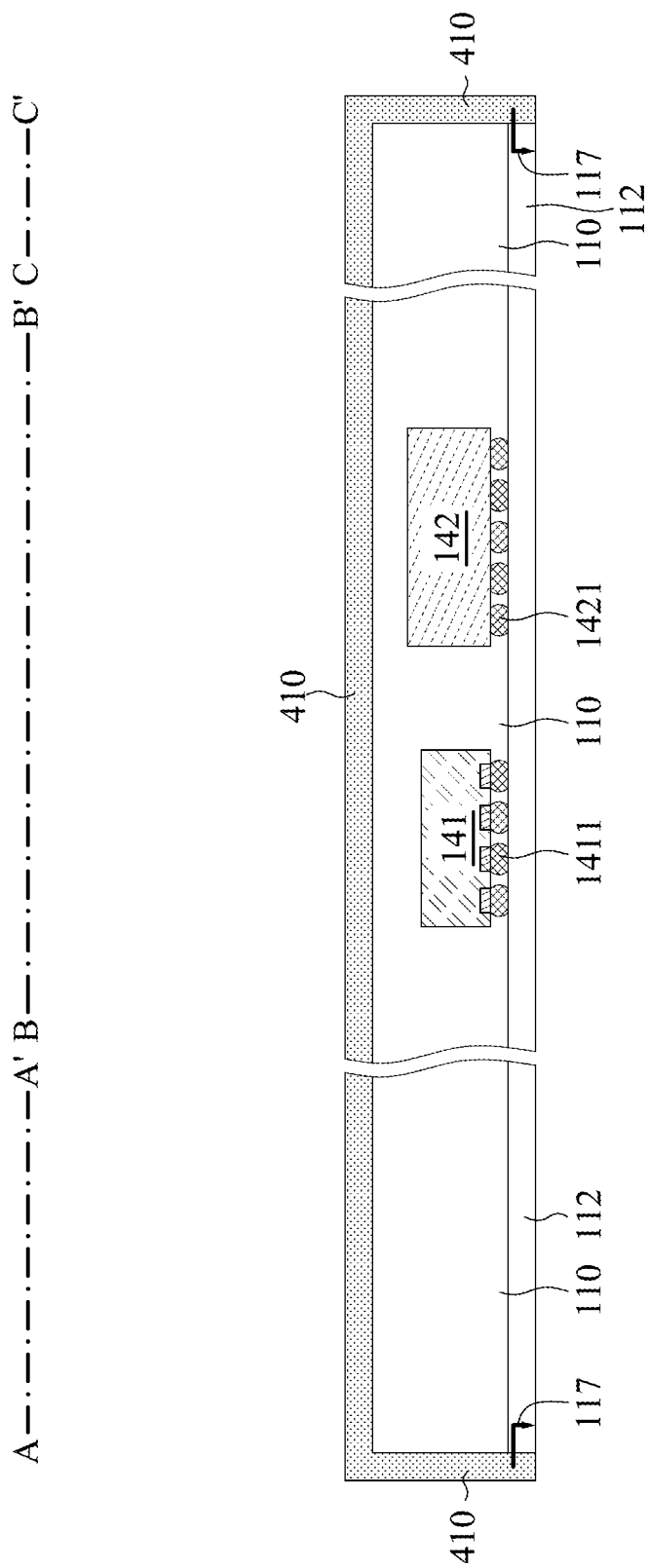
Figure 6F:
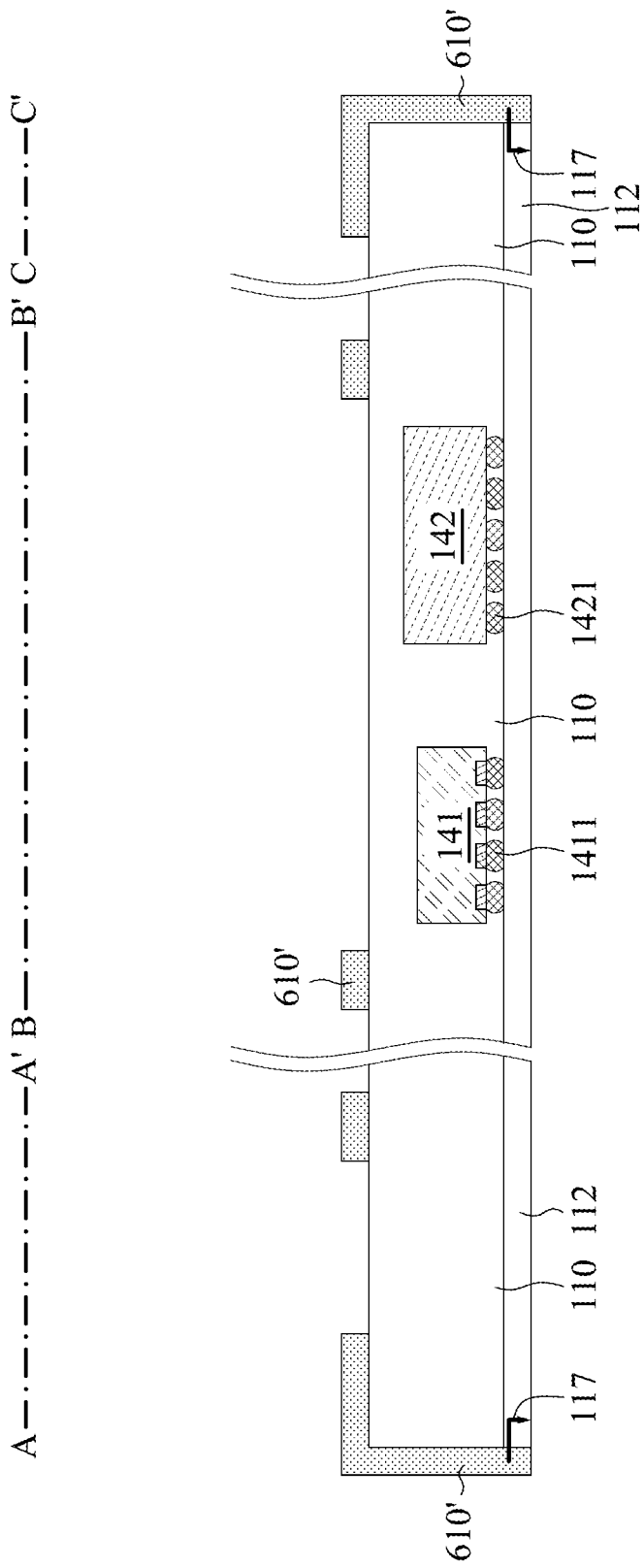

Following FIG. 6E, laser ablation is performed on the conductive layer 610, and portions of the conductive layer 610 are removed, as shown in FIG. 6F. The remaining conductive layer 610' on the encapsulant 110 may be regarded as the conductive elements 1101 shown in FIG. 5A. In addition, the remaining conductive layer 610' (i.e., conductive elements 1101) may be exposed to air, and may extend from the top surface of the encapsulant 110 to the substrate 112 though the lateral surface of the encapsulant 110, as shown in FIG. 5A and FIG. 6F. One conductive element 1101 (e.g., the feed point 114 of the electronic component 141) is electrically connected to the electronic component 141, and the other conductive element 1101 (e.g., the feed point 116 of the electronic component 142) is electrically connected to the electronic component 142, as shown in FIG. 5A.

Figure 6G:
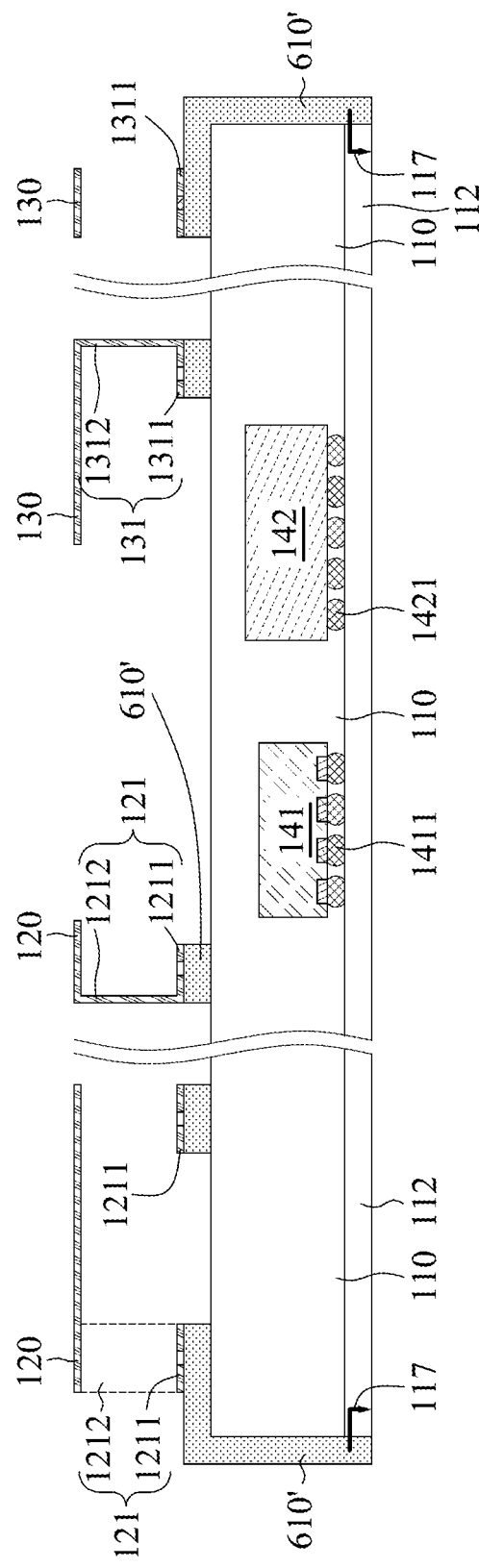
Figure 6H:
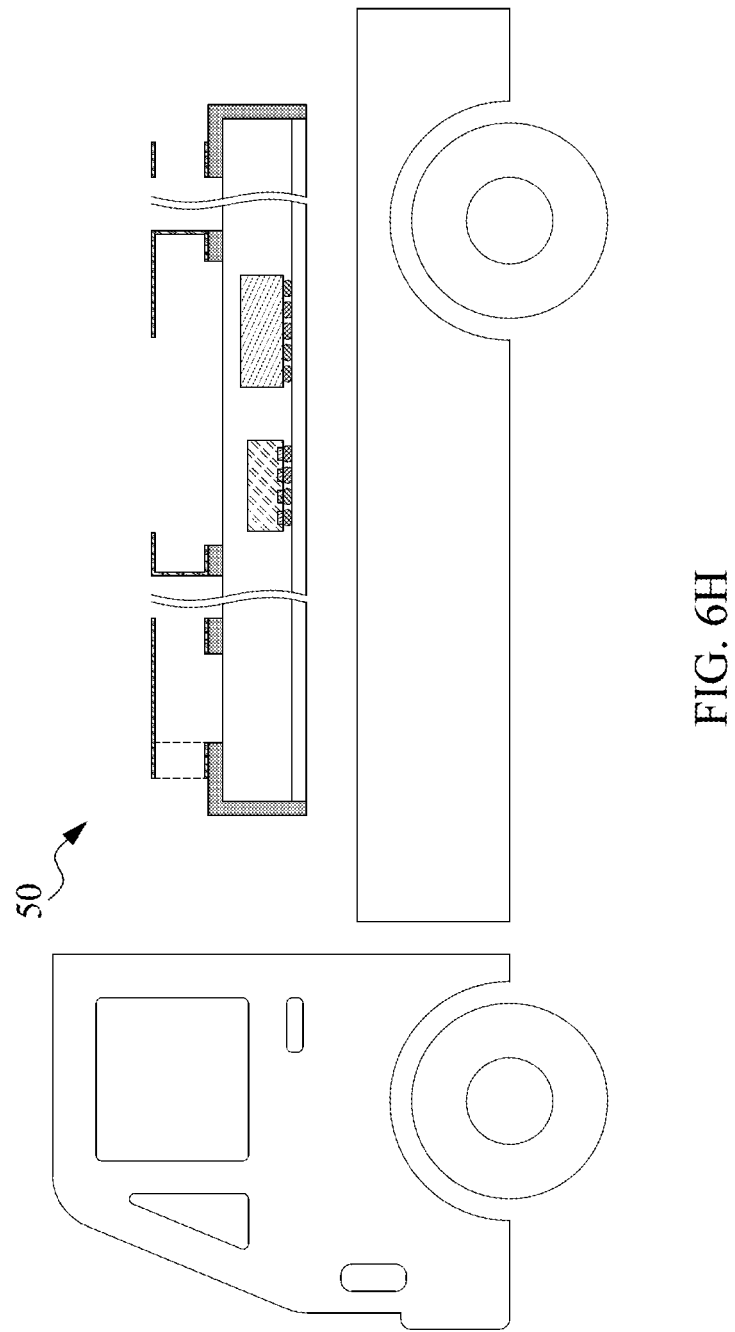

Afterwards, the antenna structures 120 and 130 are attached to the remaining conductive layer 610' by forming corresponding connection elements (e.g., solder) between each supporting element 121 and 131 and the remaining conductive layer 610', as shown in FIG. 6G. It should be noted that, although not shown in FIG. 6G, the remaining conductive layer 610' (i.e., conductive element 1101 in FIG. 5A) at point B may be electrically connected to the electronic component 141 through a redistribution layer of the substrate 112, and the remaining conductive layer 610' (i.e., conductive element 1101 in FIG. 5A) at point A may be electrically connected to a ground element (or ground layer) of the substrate 112 in a manner similar to the embodiments of FIG. 4H. Thus, manufacture of the electronic device 50 is complete and the electronic device 50 may be ready for shipping, as shown in FIG. 6H. It should be noted that FIGS. 6F to 6G are for illustrating how the antenna structure 120 is attached to the encapsulant 110, and it may not represent the precise cross-section of the electronic device 50 shown in FIG. 5A.

Figure 7:
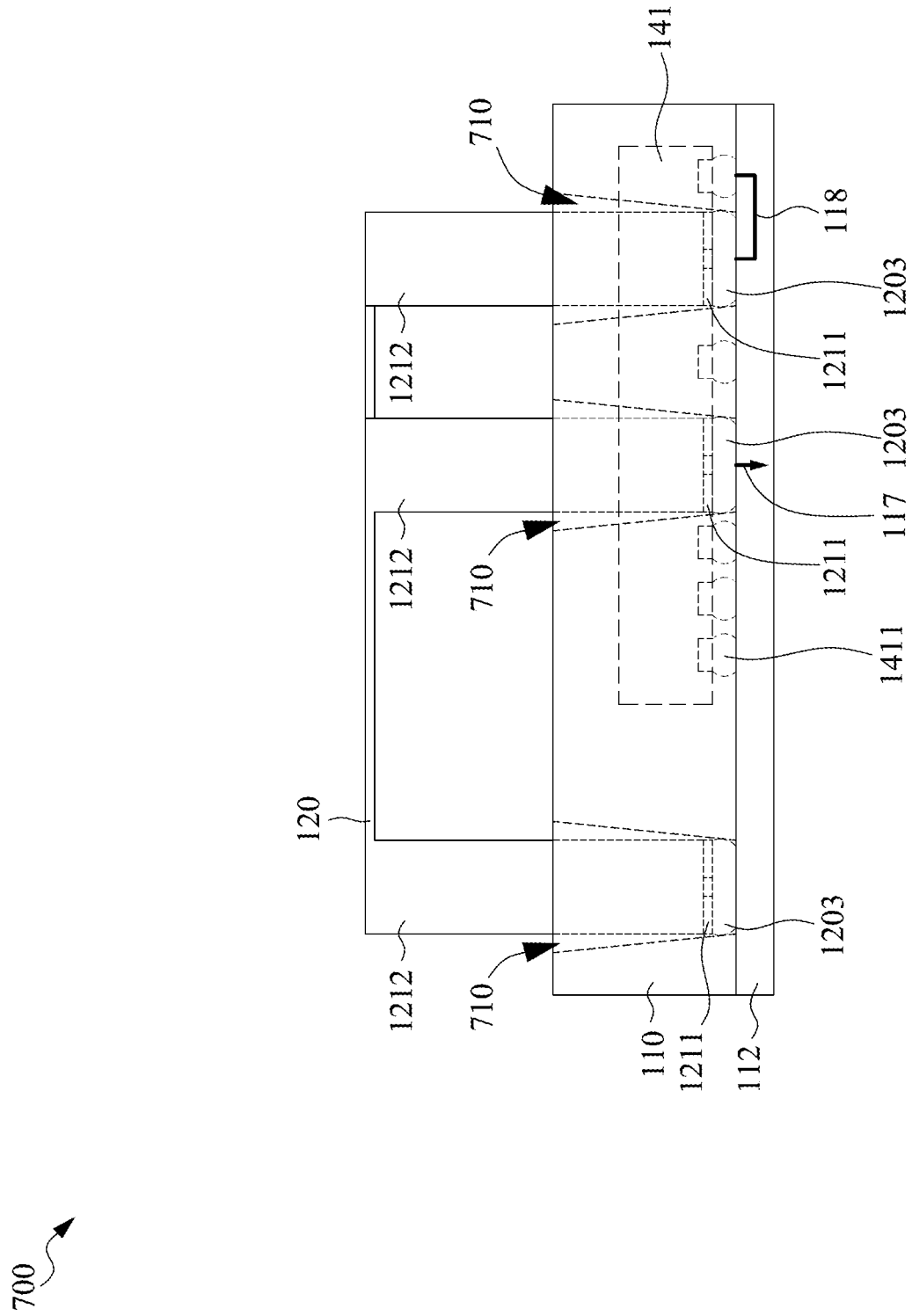
FIG. 7 is a cross-sectional view of an electronic device 700 in accordance with yet another embodiment of the present disclosure.

FIG. 7 is a partial front view of an electronic device 700 in accordance with yet another embodiment of the present disclosure. Please refer to FIG. 1A and FIG. 7.

In yet another embodiment, the manufacture flow of the electronic device 700 in FIG. 7 may be similar to that of the electronic device 10 shown in FIG. 1A, and the perspective view of the electronic device 700 is omitted for brevity. The difference between the electronic devices 700 and 10 may be that the encapsulant 110 may have one or more holes 710 that substantially align with the supporting elements 121 and 131 of the antenna structures 120 and 130 in the embodiment of FIG. 7. In addition, the height of the supporting elements 121 and 131 in FIG. 7 is higher than those in FIG. 1A. For example, the height of the supporting elements 121 and 131 in FIG. 7 is approximately equal to the height of the supporting elements 121 and 131 in FIG. 1A plus the thickness of the encapsulant 110.

For example, the supporting element 121 of the antenna structure 120 on the right of FIG. 7 may be used as a feeding element of the antenna structure 120, and it may extend to the corresponding hole 710 to electrically connect to a redistribution layer (RDL) 118 of the substrate 112 via a corresponding connection element 1203 (e.g., solder), thereby electrically connecting the antenna structure 120 to the electronic component 141. The supporting element 121 of the antenna structure 120 in the middle of FIG. 7 may be used as a grounding element of the antenna structure 120, and it may extend to the corresponding hole 710 to electrically connect to a ground element (or ground layer) 117 of the substrate 112 via a corresponding connection element 1203 (e.g., solder). The supporting element 121 of the antenna structure 120 on the left of FIG. 7 may be connected to the substrate 121 via the corresponding connection element 1203 (e.g., solder), and it may be used to support the antenna structure 120, and it may include non-electrical function. In addition, although not shown in FIG. 7, the antenna structure 130 of the electronic device 700 can be disposed on the encapsulant 110 and substrate 112 in a manner similar to the antenna structure 120 shown in FIG. 7.

Figure 8A:
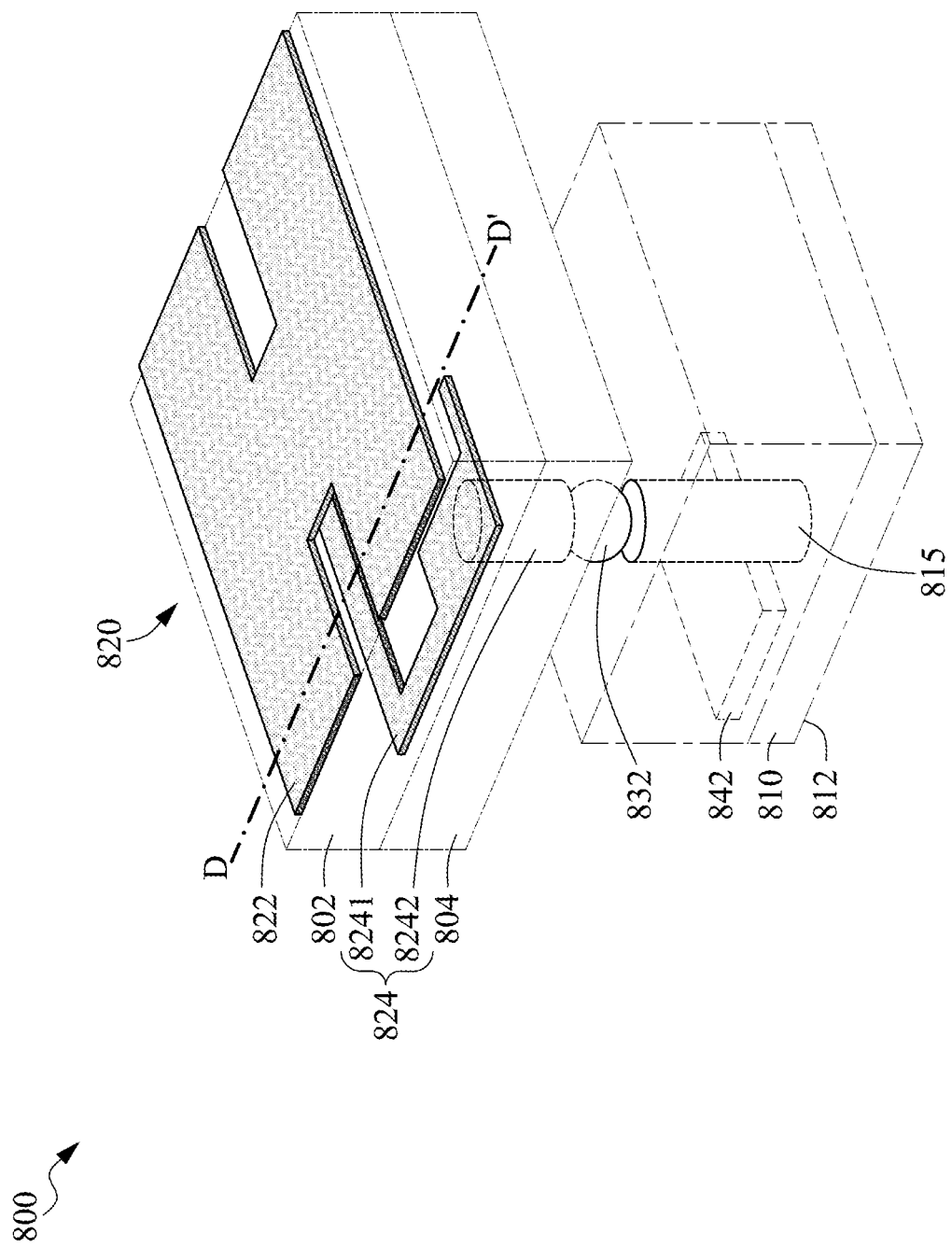
FIG. 8A is a perspective view of an electronic device 800 in accordance with yet another embodiment of the present disclosure.
Figure 8B:
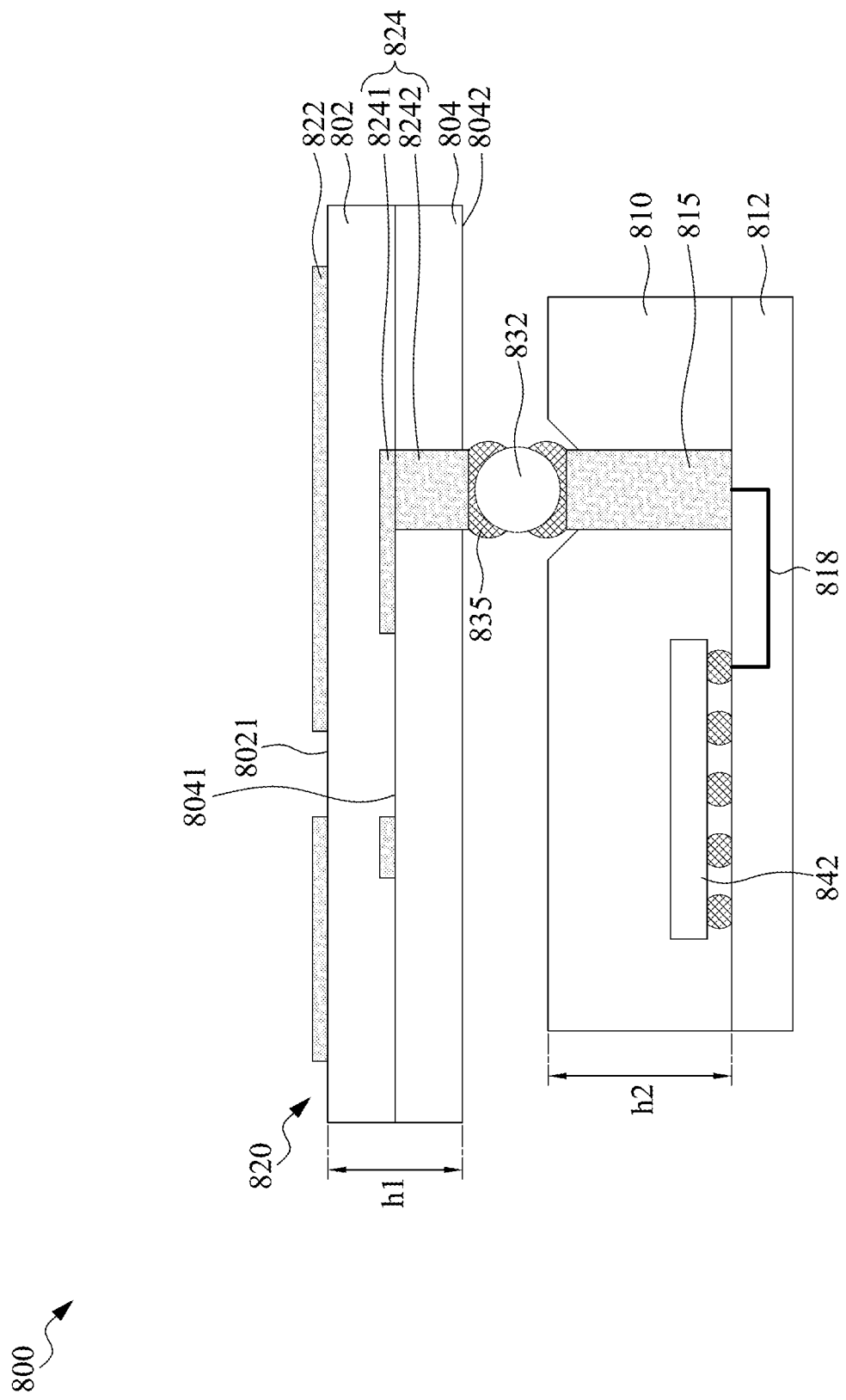
FIG. 8B is a cross-sectional view of the electronic device 800 along line AA' in FIG. 8A.

FIG. 8A is a perspective view of an electronic device 800 in accordance with yet another embodiment of the present disclosure. FIG. 8B is a cross-sectional view of the electronic device 800 along line DD' in FIG. 8A. Please refer to FIGS. 8A-8B.

The electronic device 800 may include an encapsulant 810 and an antenna structure 820. The antenna structure 820 may be disposed over and spaced apart from the encapsulant by a conductive connection component 832. The antenna structure 820 may include a first antenna pattern 824 and a second antenna pattern 822. In some embodiments, the first antenna pattern 824 may be a planar inverted-F antenna (PIFA), and the second antenna pattern 822 may be a patch antenna, but the present disclosure is not limited thereto. In some embodiments, the antenna structure 820 may support the frequency band (e.g., 7.737-8.237 GHz) of Channel 9 in the UWB protocol.

The first antenna pattern 824 and the second antenna pattern 822 may be spaced apart by an insulation layer 802. The first antenna pattern 824 may include a first portion 8241 and a second portion 8242, where the first portion 8241 may be disposed on a top surface 8041 of an insulation layer 804, and the second portion 8242 may be extend from the first portion 8241 through the insulation layer 804, where part of the second portion 8242 protrudes from the bottom surface 8042 of insulation layer 804. The second antenna pattern 822 may be disposed on a top surface 8021 of the insulation layer 802. The insulation layers 802 and 804 may include the same insulation material, such as FR-4, but the present disclosure is not limited thereto. In some embodiments, the insulation layers 802 and 804 may have the same thickness, and the overall thickness h1 of the insulation layers 802 and 804 may be approximately 3.2 mm, but the present disclosure is not limited thereto. In some other embodiments, the insulation layers 802 and 804 may have different thicknesses, and the overall thickness h1 of the insulation layers 802 and 804 may be approximately 3.2 mm, but the present disclosure is not limited thereto.

For example, the conductive connection element 832 may be a copper ball or other conductive material, but the present disclosure is not limited thereto. In some embodiments, the conductive connection element 832 may be surrounded by a connection element 835. The connection element 835 may be an underfill to increase strength of the conductive connection element 832 for supporting the antenna structure 820. In some other embodiments, the conductive element 835 may be soldering materials connected between the second portion 8242 and the conductive connection element 835, and between the conductive element 815 and the conductive connection element 835. In addition, a conductive element 815 may be disposed on a substrate 812, and encapsulated by the encapsulant 810. The conductive element 815 may be a pillar, a solder ball, an interposer, or any other type of interconnection component, and it may be implemented using one of the metal materials such as copper, gold, aluminum, etc., but the present disclosure is not limited thereto.

An electronic component 842 (e.g., a UWB transceiver) supporting the UWB protocol may be disposed on the substrate 812, and it is also encapsulated by the encapsulant 810. The conductive element 815 may be used as a feed point or feed element of the antenna structure 820. Thus, the antenna structure 820 may be electrically connected to the electronic component 842 disposed on substrate 812 through the conductive connection element 832, the conductive element 815, and the redistribution layer (RDL) 818 of the substrate 812, as shown in FIG. 8B. In some embodiments, the thickness of the encapsulant 810 may be approximately 0.8 mm to 1 mm, but the present disclosure is not limited thereto.

In some embodiments, the width of the antenna structure 820 may be wider than the encapsulant 810, as shown in FIG. 8B. In some other embodiments, the width of the antenna structure 820 may be narrower than the encapsulant 810. In other words, the width of the antenna structure 820 may be adjusted depending on practical design needs.

Figure 9A:
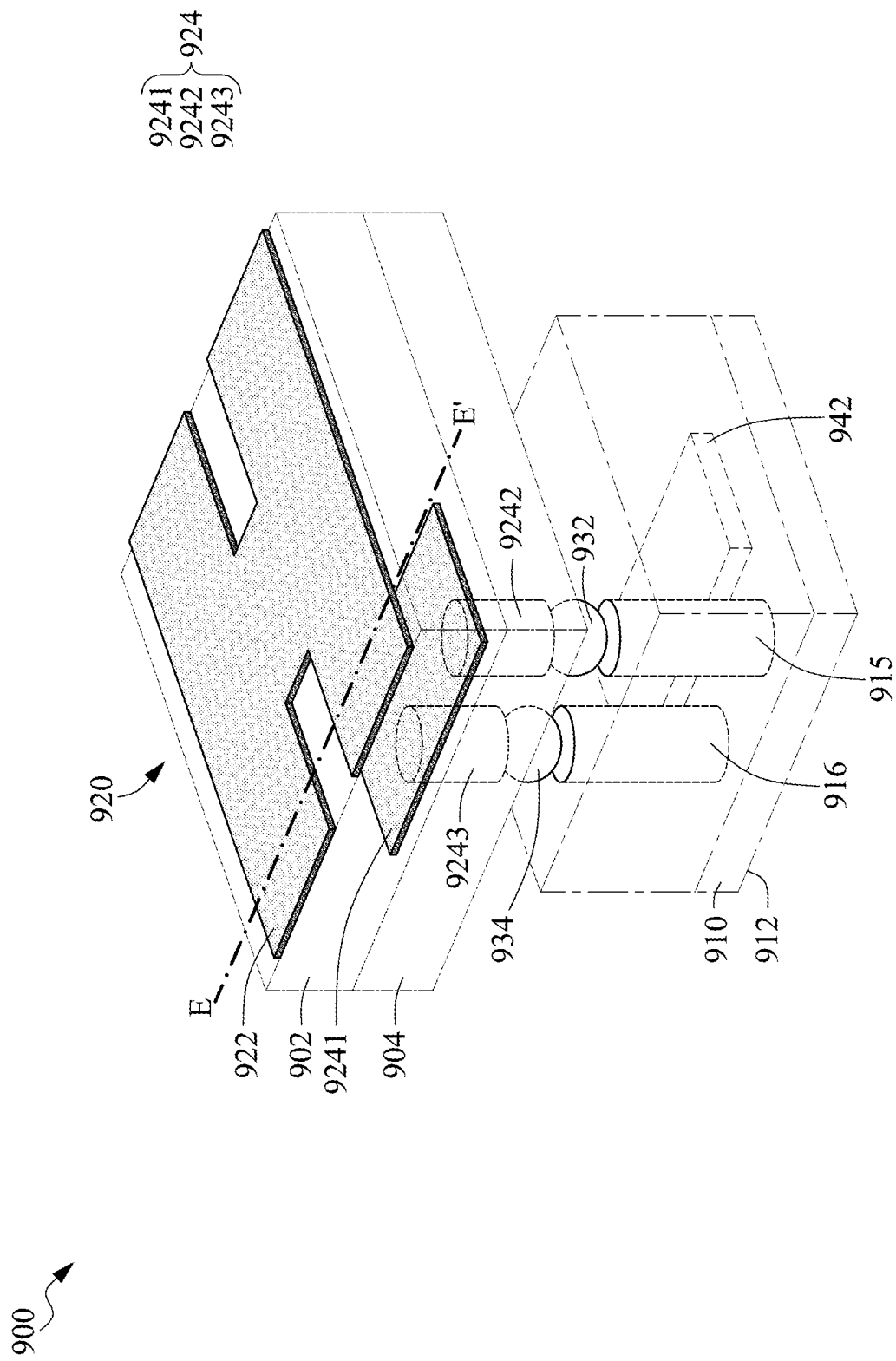
FIG. 9A is a perspective view of an electronic device 900 in accordance with yet another embodiment of the present disclosure.
Figure 9B:
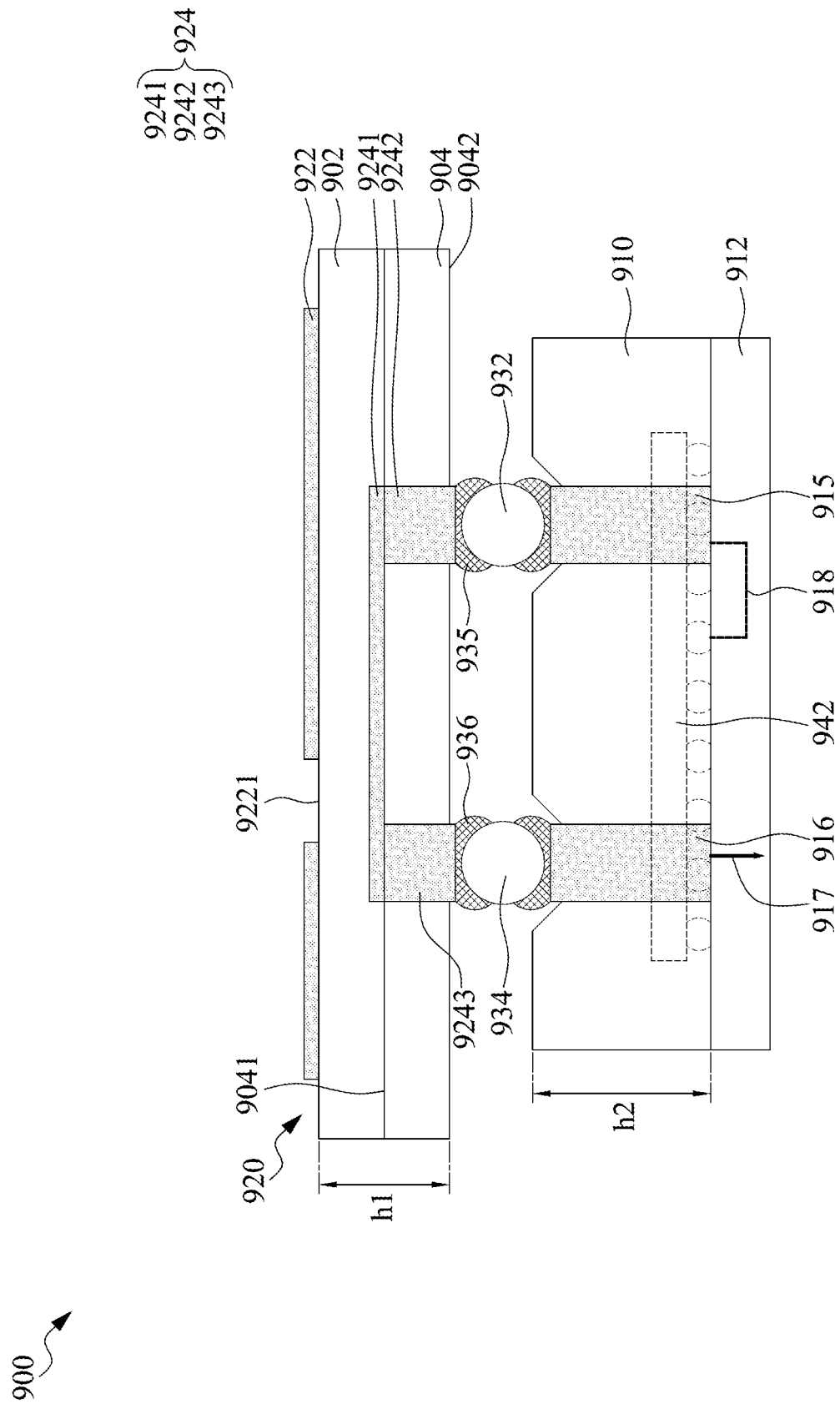
FIG. 9B is a cross-sectional view of the electronic device 900 along line EE' in FIG. 9A.

FIG. 9A is a perspective view of an electronic device 900 in accordance with yet another embodiment of the present disclosure. FIG. 9B is a cross-sectional view of the electronic device 900 along line EE' in FIG. 9A. Please refer to FIGS. 9A-9B.

The electronic device 900 shown in FIGS. 9A-9B may be similar to the electronic device 800 shown in FIGS. 8A-8B, with the difference therebetween that the antenna structure 920 may be grounded through a conductive connection element 934 and a conductive element 916, where the conductive element 916 may be connected to a ground element (or ground layer) 917 of the substrate 912. The antenna structure 920 can be electrically connected to the electronic component 942 through the conductive connection element 932, the conductive element 915, and the redistribution layer 918 of the substrate 912. The conductive connection element 934 may be similar to the conductive connection element 932, and it may be surrounded by an underfill 936 to increase strength of the conductive connection element 934 for supporting the antenna structure 920. The conductive element 916 may be similar to the conductive element 915, and they may be implemented using one of the metal materials such as copper, gold, aluminum, etc., but the present disclosure is not limited thereto.

In some embodiments, the electronic device 900 may be a dual-band UWB device which supports the frequency bands of Channel 5 and Channel 9 of the UWB protocol, such as 6.240-6.739 GHz and 7.737-8.237 GHz.

In some embodiments, the width of the antenna structure 920 may be wider than the encapsulant 910, as shown in FIG. 9B. In some other embodiments, the width of the antenna structure 920 may be narrower than the encapsulant 910. In other words, the width of the antenna structure 920 may be adjusted depending on practical design needs.

Figure 10A:
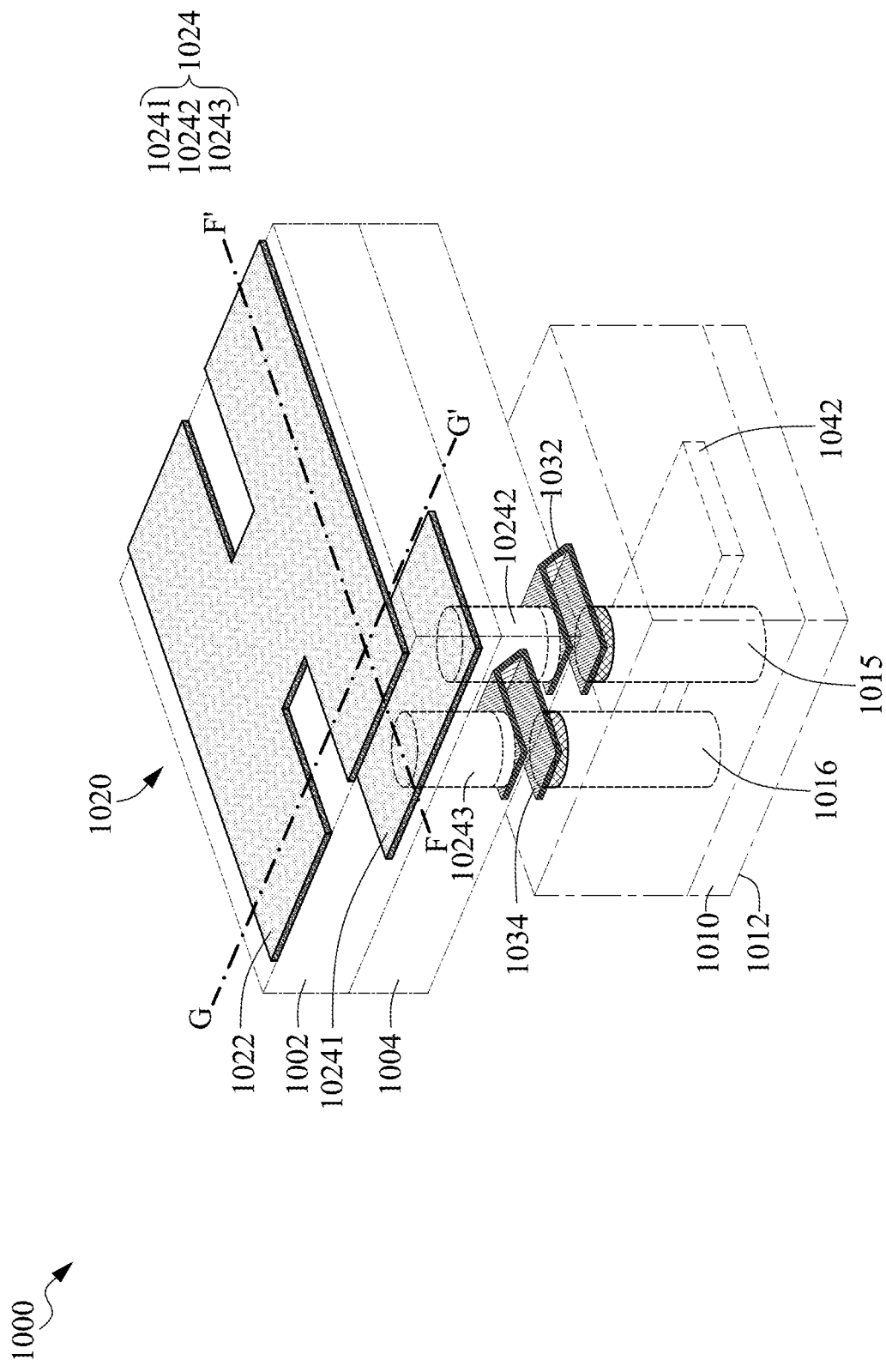
FIG. 10A is a perspective view of an electronic device 1000 in accordance with yet another embodiment of the present disclosure.
Figure 10B:
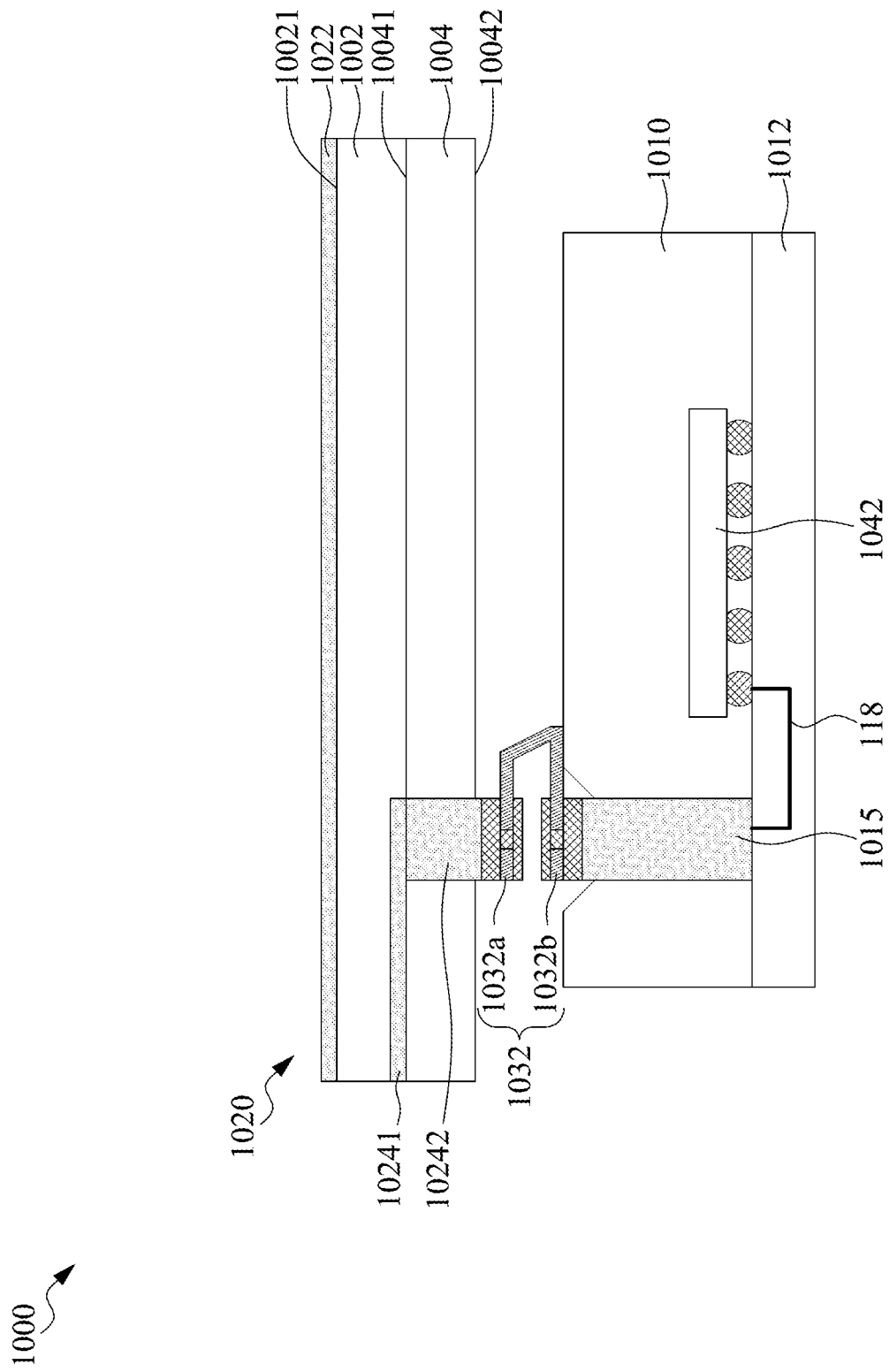
FIG. 10B is a cross-sectional view of the electronic device 1000 along line FF' in FIG. 10A.
Figure 10C:
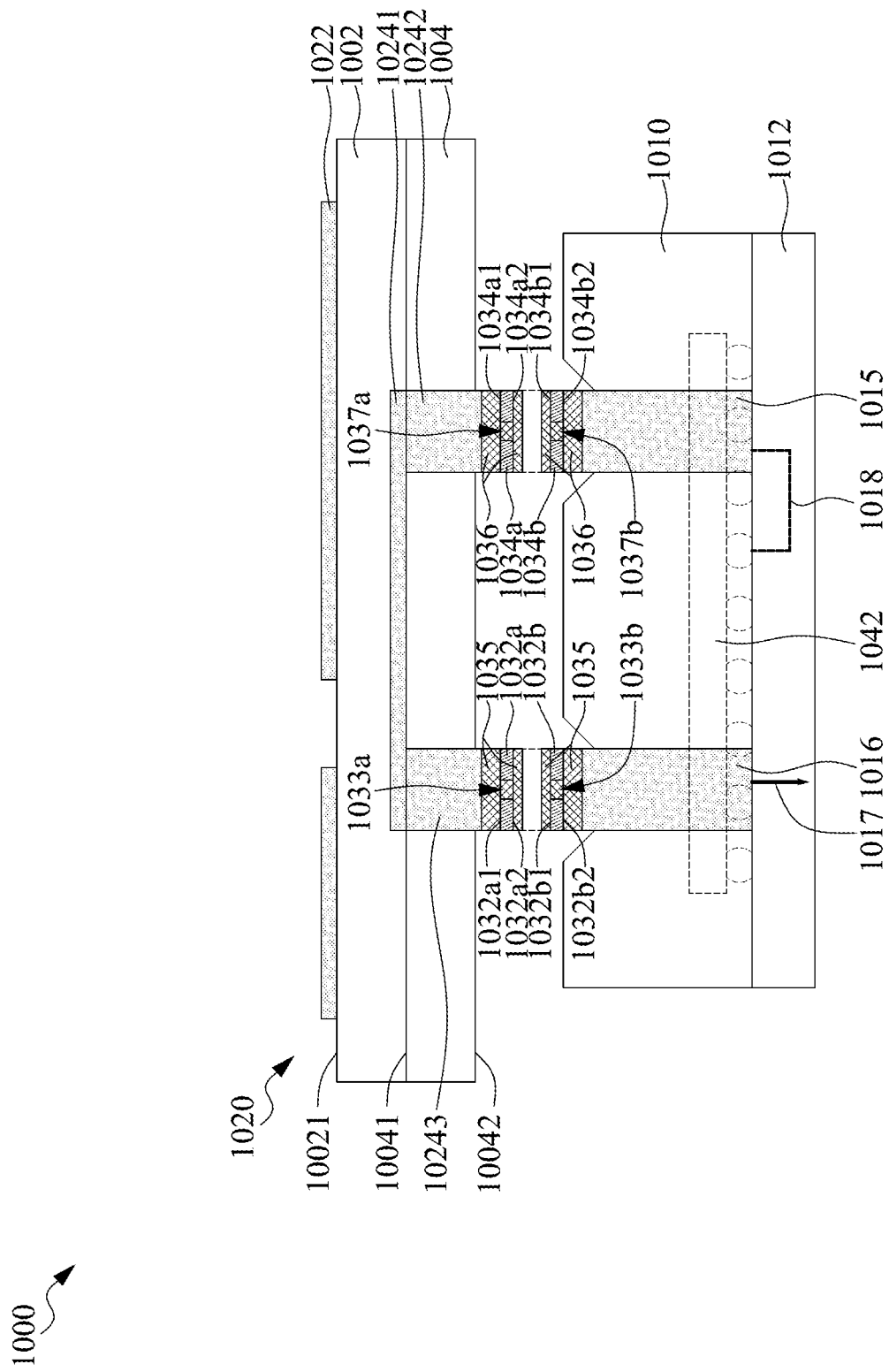
FIG. 10C is a cross-sectional view of the electronic device 1000 along line GG' in FIG. 10A.

FIG. 10A is a perspective view of an electronic device 1000 in accordance with yet another embodiment of the present disclosure. FIG. 10B is a cross-sectional view of the electronic device 1000 along line FF' in FIG. 10A. FIG. 10C is a cross-sectional view of the electronic device 1000 along line GG' in FIG. 10A. Please refer to FIGS. 10A-10C.

The electronic device 1000 shown in FIGS. 10A-10B may be similar to the electronic device 900 shown in FIGS. 9A-9B, with the difference therebetween that the conductive connection elements 1032 and 1034 may be conductive clips in FIGS. 10A-10B. For example, the conductive connection elements 1032 and 1034 may be configured to buffer a stress between the antenna structure 1020 and the encapsulant 1010. The aforementioned stress may be induced when the antenna structure 1020 is attached on the encapsulant 1010 using a surface mounted technology (SMT), and the design of the conductive connection elements 1032 and 1034 using conductive clips can further improve the reliability of the electronic device 1000.

In some embodiments, the conductive connection element 1032 shown in FIG. 10B may include a first portion 1032a and a second portion 1032b. The first portion 1032a may be connected to the antenna structure 1020 via a connection element 1035, and the second portion 1032b may be connected to the conductive element 1016 via another connection element 1035. The connection element 1035 may comprise soldering materials. The conductive element 1016 may be connected to a ground element (or ground layer) 1017 of the substrate 1012. In addition, the first portion 1032a may include a hole 1033a, and the second portion 1032b may include a hole 1033b. Thus, the antenna structure 1020 can be attached to the first portion 1032a by forming a connection element 1035 between the antenna structure 1020 and the first portion 1032a, and the connection element 1035 may extend from a top surface 1032a1 to a bottom surface 1032a2 of the first portion 1032a. The conductive element 1016 may be attached to the second portion 1032b by forming the corresponding connection element 1035 between the conductive element 1016 and the second portion 1032b in a similar manner, and the connection element 1035 may extend from a top surface 1032b1 to a bottom surface 1032b2 of the second portion 1032b.

In addition, the conductive connection element 1034 shown in FIG. 10B may include a first portion 1034a and a second portion 1034b. The first portion 1034a may be connected to the antenna structure 1020 via a connection element 1036, and the second portion 1034b may be connected to the conductive element 1015 via another connection element 1036. The connection element 1036 may comprise soldering materials. In addition, the first portion 1034a may include a hole 1037a, and the second portion 1034b may include a hole 1037b. Thus, the antenna structure 1020 can be attached to the first portion 1034a by forming a connection element 1036 between the antenna structure 1020 and the first portion 1034a, and the connection element 1036 may extend from a top surface 1034a1 to a bottom surface 1034a2 of the first portion 1034a. The conductive element 1015 may be attached to the second portion 1034b by forming the corresponding connection element 1036 between the conductive element 1015 and the second portion 1034b in a similar manner, and the connection element 1036 may extend from a top surface 1034b1 to a bottom surface 1034b2 of the second portion 1034b.

As used herein, the singular terms "a," "an," and "the" may include a plurality of referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to #1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
    an encapsulant;
    a substrate disposed under the encapsulant;
    an electronic component disposed in the encapsulant;
    an antenna structure having an antenna pattern exposed to air and facing the encapsulant, and a first supporting element separating the antenna pattern from the encapsulant;
    a first conductive element having at least a portion within the encapsulant and configured to function as a feed element, wherein the first conductive element is electrically connected with the electronic component through the substrate, and wherein the antenna pattern is electrically connected with the electronic component through the first supporting element and the first conductive element;
    a second conductive element having at least a portion within the encapsulant and configured to ground the antenna structure; and
    a second supporting element electrically connecting the second conductive element to the antenna pattern,
    wherein the first supporting element comprises:
        a first portion substantially parallel to a top surface of the encapsulant and having a hole; and
        a second portion extending between the first portion and the antenna pattern, wherein a connection element is disposed within the hole of the first portion.

2. The electronic device of claim 1, further comprising:
    a third supporting element disposed between the encapsulant and the antenna pattern and directly contacting the encapsulant.

3. The electronic device of claim 2, wherein the first supporting element is disposed at a first edge of the encapsulant, the second supporting element is disposed at a first corner of the encapsulant, and the third supporting element is disposed at a second corner of the encapsulant.

4. The electronic device of claim 3, wherein the first corner is defined by the first edge and a second edge of the encapsulant, and the second corner is defined by the second edge and a third edge of the encapsulant.

5. The electronic device of claim 1, wherein the connection element electrically connects the first conductive element with the first supporting element.

6. The electronic device of claim 1, wherein the connection element is in contact with a top surface of the first portion and a bottom surface of the first portion through the hole.

7. The electronic device of claim 4, wherein the third edge is opposite to the first edge.

8. An electronic device, comprising:
an encapsulant;
a first antenna structure having a first antenna pattern and a first supporting element separating the first antenna pattern from the encapsulant;
a second antenna structure having a second antenna pattern and a second supporting element separating the second antenna pattern from the encapsulant; and
a conductive layer disposed on a surface of the encapsulant,
wherein the first supporting element is configured to function as a feed element of the first antenna pattern and separate the first antenna pattern from the conductive layer, and
wherein the first antenna pattern is operating in a first frequency, and the second antenna pattern is operating in a second frequency different from the first frequency.

9. The electronic device of claim 8, wherein the encapsulant comprises a first edge and a second edge distinct from the first edge, the first antenna structure is disposed along the first edge, and the second antenna structure is disposed along the second edge.

10. The electronic device of claim 9, wherein the encapsulant further comprises a third edge opposite to the second edge, and the first antenna structure further extends along the third edge.

11. The electronic device of claim 10, wherein;
the encapsulant further comprises a fourth edge opposite to the first edge, and the first antenna structure further extends along the fourth edge,
the electronic device further comprises a first electronic component encapsulated by the encapsulant and a second electronic component encapsulated by the encapsulant,
the first supporting element is adjacent to the first edge and is electrically connected to the first electronic component, and
the second supporting element is adjacent to the fourth edge and is electrically connected to the second electronic component.

12. The electronic device of claim 8, wherein the first antenna structure has a third supporting element separating the first antenna pattern from the encapsulant and connecting the conductive layer.

13. The electronic device of claim 11, further comprising:
a substrate disposed under the encapsulant; and
a first conductive element having at least a portion within the encapsulant and electrically connected with the first electronic component through the substrate.

14. The electronic device of claim 13, further comprising:
a second conductive element having at least a portion within the encapsulant,
wherein the first conductive element is configured to function as a feed element of the first antenna structure, and the second conductive element is configured to ground the first antenna structure.

* * * * *